United States Patent
Xu et al.

(10) Patent No.: US 12,132,502 B1
(45) Date of Patent: Oct. 29, 2024

(54) PACKET-BASED UNIVERSAL BIT-FIELD MASKING CODING USING CONFIGURABLE SPARSITY INFORMATION

(71) Applicant: QUALCOMM Incorporated, San Diego, CA (US)

(72) Inventors: Haoping Xu, North York (CA); Prajakt Kulkarni, San Diego, CA (US); Suze Balatsos, Markham (CA); Zhaohui Du, Markham (CA); Shiqi Sun, Newmarket (CA); Xiaoxuan Yu, Richmond Hill (CA); Nanda Kumar Aswatha Kumar, North York (CA); Sheng Zhan, Richmond Hill (CA)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 18/483,389

(22) Filed: Oct. 9, 2023

(51) Int. Cl.
*G06F 16/30* (2019.01)
*H03M 7/30* (2006.01)

(52) U.S. Cl.
CPC ....... *H03M 7/3066* (2013.01); *H03M 7/6011* (2013.01); *H03M 7/6076* (2013.01)

(58) Field of Classification Search
CPC .............................. G06F 16/27; H03M 7/3066
See application file for complete search history.

(56) References Cited

U.S. PATENT DOCUMENTS

| 2017/0053376 | A1* | 2/2017 | Bolz | ...................... H04N 19/91 |
| 2018/0083777 | A1* | 3/2018 | Dai | ...................... H04W 12/043 |
| 2021/0174259 | A1* | 6/2021 | Miao | ...................... H03M 7/3088 |
| 2021/0274225 | A1 | 9/2021 | Makeev et al. | |
| 2022/0085827 | A1* | 3/2022 | Takatsukasa | ............ H03M 7/40 |
| 2023/0071352 | A1* | 3/2023 | Corkery | ............... G06F 13/1673 |
| 2024/0220259 | A1* | 7/2024 | Tohara | ................ G06F 9/30038 |
| 2024/0273163 | A1* | 8/2024 | Gao | ........................ G06F 17/16 |

FOREIGN PATENT DOCUMENTS

| JP | 4972128 B2 | 7/2012 |
| WO | 2012068969 A9 | 1/2013 |
| WO | 2014089087 A1 | 6/2014 |
| WO | 2019041833 A1 | 3/2019 |

\* cited by examiner

*Primary Examiner* — Khanh B Pham
(74) *Attorney, Agent, or Firm* — QUALCOMM Incorporated

(57) ABSTRACT

Systems and techniques are provided for compressing data. A process can include generating a compressed sub-packet by removing one or more sparsity bytes from a sequence of values corresponding to a sub-packet, the sequence of values including one or more sparsity bytes each equal to a configured sparsity value and one or more non-sparsity bytes each corresponding to a respective data value different from the configured sparsity value. A sub-packet header can be generated for the compressed sub-packet, and indicative of a respective location within the sequence of values of each non-sparsity byte. A packet header can be generated for a plurality of compressed sub-packets, and indicative of the configured sparsity value and respective coding information for each compressed sub-packet. A compressed data packet can be generated to include at least the packet header, the sub-packet header, and the one or more non-sparsity bytes included in the sequence of values.

30 Claims, 13 Drawing Sheets

1000

Generate A First Compressed Sub-Packet Based On Removing One Or More Sparsity Bytes From A First Sequence Of Values Corresponding To A First Sub-Packet, Wherein The First Sequence Of Values Includes One Or More Sparsity Bytes Each Equal To A Configured Sparsity Value And One Or More Non-Sparsity Bytes Each Corresponding To A Respective Data Value Different From The Configured Sparsity Value
1002

Generate A First Sub-Packet Header Corresponding To The First Compressed Sub-Packet, Wherein The First Sub-Packet Header Is Indicative Of A Respective Location Within The First Sequence Of Values Of Each Non-Sparsity Byte Of The One Or More Non-Sparsity Bytes
1004

Generate A First Packet Header Corresponding To A Plurality Of Compressed Sub-Packets Including The First Compressed Sub-Packet, Wherein The First Packet Header Is Indicative Of The Configured Sparsity Value And Respective Coding Information Corresponding To Each Compressed Sub-Packet Of The Plurality Of Compressed Sub-Packets
1006

Generate A Compressed Data Packet, Wherein The Compressed Data Packet Includs At Least The First Packet Header, The First Sub-Packet Header, And The One Or More Non-Sparsity Bytes Included In The First Sequence Of Values
1008

FIG. 10

PACKET-BASED UNIVERSAL BIT-FIELD MASKING CODING USING CONFIGURABLE SPARSITY INFORMATION

FIELD

The present disclosure generally relates to data compression based on sparsity in a machine learning network. For example, aspects of the present disclosure are related to systems and techniques for performing universal bit-field masking coding (UBFMC) compression for machine learning data and/or parameters with sparsity.

BACKGROUND

Many devices and systems allow a scene to be captured by generating images (or frames) and/or video data (including multiple frames) of the scene. For example, a camera or a device including a camera can capture a sequence of frames of a scene (e.g., a video of a scene). In some cases, the sequence of frames can be processed for performing one or more functions, can be output for display, can be output for processing and/or consumption by other devices, among other uses.

An artificial neural network attempts to replicate, using computer technology, logical reasoning performed by the biological neural networks that constitute animal brains. Deep neural networks, such as convolutional neural networks, are widely used for numerous applications, such as object detection, object classification, object tracking, big data analysis, among others. For example, convolutional neural networks are able to extract high-level features, such as facial shapes, from an input image, and use these high-level features to output a probability that, for example, an input image includes a particular object.

SUMMARY

The following presents a simplified summary relating to one or more aspects disclosed herein. Thus, the following summary should not be considered an extensive overview relating to all contemplated aspects, nor should the following summary be considered to identify key or critical elements relating to all contemplated aspects or to delineate the scope associated with any particular aspect. Accordingly, the following summary has the sole purpose to present certain concepts relating to one or more aspects relating to the mechanisms disclosed herein in a simplified form to precede the detailed description presented below.

Disclosed are systems, methods, apparatuses, and computer-readable media for data compression. According to at least one illustrative example, a method of data compression is provided, the method including: generating a first compressed sub-packet based on removing one or more sparsity bytes from a first sequence of values corresponding to a first sub-packet, wherein the first sequence of values includes one or more sparsity bytes each equal to a configured sparsity value and one or more non-sparsity bytes each corresponding to a respective data value different from the configured sparsity value; generating a first sub-packet header corresponding to the first compressed sub-packet, wherein the first sub-packet header is indicative of a respective location within the first sequence of values of each non-sparsity byte of the one or more non-sparsity bytes; generating a first packet header corresponding to a plurality of compressed sub-packets including the first compressed sub-packet, wherein the first packet header is indicative of the configured sparsity value and respective coding information corresponding to each compressed sub-packet of the plurality of compressed sub-packets; and generating a compressed data packet, wherein the compressed data packet includes at least the first packet header, the first sub-packet header, and the one or more non-sparsity bytes included in the first sequence of values.

In another illustrative example, an apparatus for compressing data is provided. The apparatus includes at least one memory and at least one processor coupled to the at least one memory and configured to: generate a first compressed sub-packet based on removing one or more sparsity bytes from a first sequence of values corresponding to a first sub-packet, wherein the first sequence of values includes one or more sparsity bytes each equal to a configured sparsity value and one or more non-sparsity bytes each corresponding to a respective data value different from the configured sparsity value; generate a first sub-packet header corresponding to the first compressed sub-packet, wherein the first sub-packet header is indicative of a respective location within the first sequence of values of each non-sparsity byte of the one or more non-sparsity bytes; generate a first packet header corresponding to a plurality of compressed sub-packets including the first compressed sub-packet, wherein the first packet header is indicative of the configured sparsity value and respective coding information corresponding to each compressed sub-packet of the plurality of compressed sub-packets; and generate a compressed data packet, wherein the compressed data packet includes at least the first packet header, the first sub-packet header, and the one or more non-sparsity bytes included in the first sequence of values.

In another illustrative example, a non-transitory computer-readable storage medium comprising instructions stored thereon which, when executed by at least one processor, causes the at least one processor to: generate a first compressed sub-packet based on removing one or more sparsity bytes from a first sequence of values corresponding to a first sub-packet, wherein the first sequence of values includes one or more sparsity bytes each equal to a configured sparsity value and one or more non-sparsity bytes each corresponding to a respective data value different from the configured sparsity value; generate a first sub-packet header corresponding to the first compressed sub-packet, wherein the first sub-packet header is indicative of a respective location within the first sequence of values of each non-sparsity byte of the one or more non-sparsity bytes; generate a first packet header corresponding to a plurality of compressed sub-packets including the first compressed sub-packet, wherein the first packet header is indicative of the configured sparsity value and respective coding information corresponding to each compressed sub-packet of the plurality of compressed sub-packets; and generate a compressed data packet, wherein the compressed data packet includes at least the first packet header, the first sub-packet header, and the one or more non-sparsity bytes included in the first sequence of values.

In another illustrative example, an apparatus is provided for compressing data. The apparatus includes: means for generating a first compressed sub-packet based on removing one or more sparsity bytes from a first sequence of values corresponding to a first sub-packet, wherein the first sequence of values includes one or more sparsity bytes each equal to a configured sparsity value and one or more non-sparsity bytes each corresponding to a respective data value different from the configured sparsity value; means for generating a first sub-packet header corresponding to the first compressed sub-packet, wherein the first sub-packet header is indicative of a respective location within the first sequence of values of each non-sparsity byte of the one or more non-sparsity bytes; means for generating a first packet header corresponding to a plurality of compressed sub-packets including the first compressed sub-packet, wherein the first packet header is indicative of the configured sparsity value and respective coding information corresponding to each compressed sub-packet of the plurality of compressed sub-packets; and means for generating a compressed data packet, wherein the compressed data packet includes at least the first packet header, the first sub-packet header, and the one or more non-sparsity bytes included in the first sequence of values.

Aspects generally include a method, apparatus, system, computer program product, non-transitory computer-readable medium, user device, user equipment, wireless communication device, and/or processing system as substantially described with reference to and as illustrated by the drawings and specification.

Some aspects include a device having a processor configured to perform one or more operations of any of the methods summarized above. Further aspects include processing devices for use in a device configured with processor-executable instructions to perform operations of any of the methods summarized above. Further aspects include a non-transitory processor-readable storage medium having stored thereon processor-executable instructions configured to cause a processor of a device to perform operations of any of the methods summarized above. Further aspects include a device having means for performing functions of any of the methods summarized above.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages will be better understood from the following description when considered in connection with the accompanying figures. Each of the figures is provided for the purposes of illustration and description, and not as a definition of the limits of the claims. The foregoing, together with other features and aspects, will become more apparent upon referring to the following specification, claims, and accompanying drawings.

This summary is not intended to identify key or essential features of the claimed subject matter, nor is it intended to be used in isolation to determine the scope of the claimed subject matter. The subject matter should be understood by reference to appropriate portions of the entire specification of this patent, any or all drawings, and each claim.

BRIEF DESCRIPTION OF THE DRAWINGS

The accompanying drawings are presented to aid in the description of various aspects of the disclosure and are provided solely for illustration of the aspects and not limitation thereof. So that the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects. The same reference numbers in different drawings may identify the same or similar elements.

FIG. 10 is a flow diagram illustrating an example of a process for data compression, in accordance with some examples;

DETAILED DESCRIPTION

Figure 1:
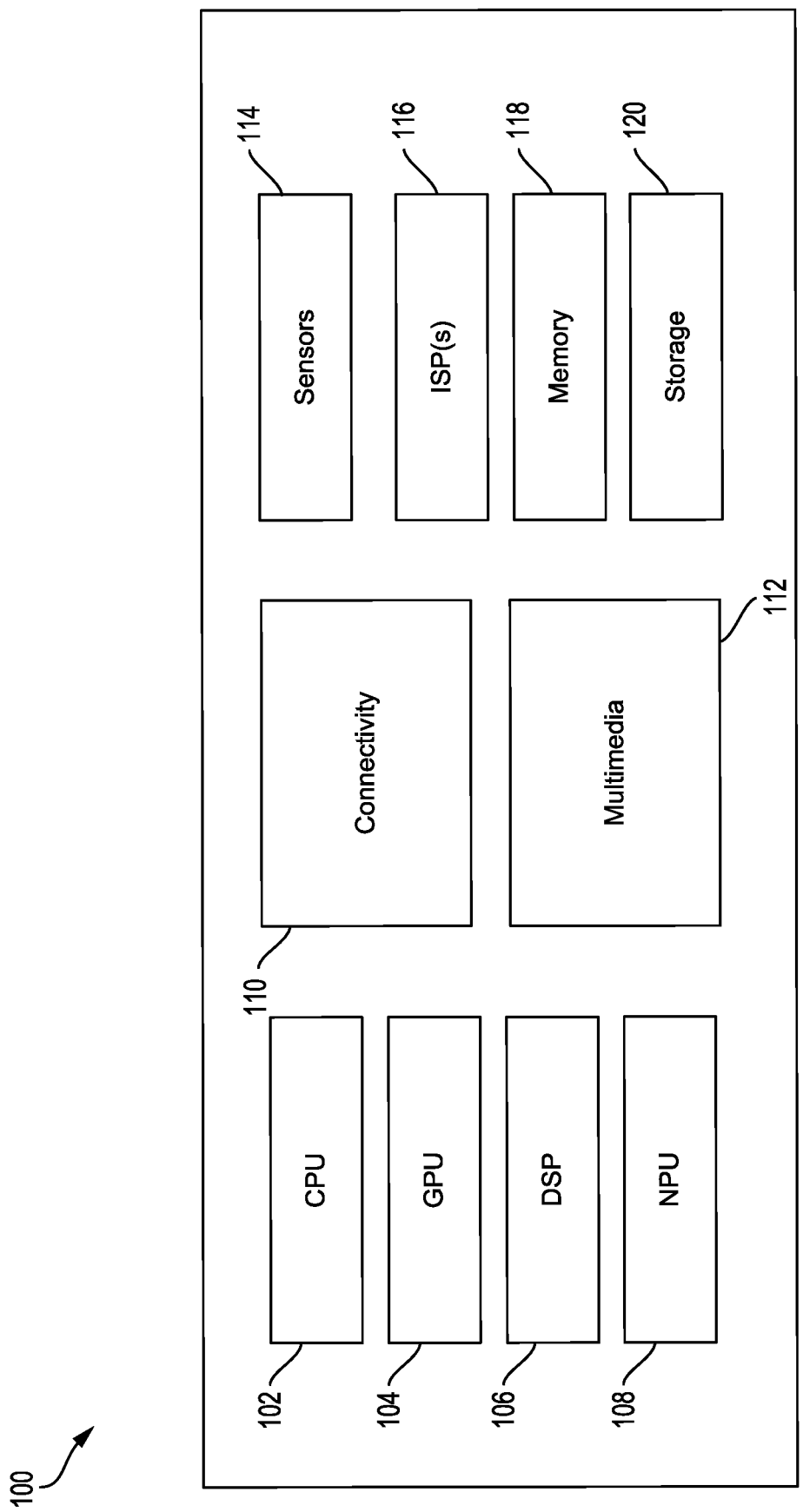
FIG. 1 illustrates an example implementation of a system-on-a-chip (SoC), in accordance with some examples.

Certain aspects of this disclosure are provided below for illustration purposes. Alternate aspects may be devised without departing from the scope of the disclosure. Additionally, well-known elements of the disclosure will not be described in detail or will be omitted so as not to obscure the relevant details of the disclosure. Some of the aspects described herein may be applied independently and some of them may be applied in combination as would be apparent to those of skill in the art. In the following description, for the purposes of explanation, specific details are set forth in order to provide a thorough understanding of aspects of the application. However, it will be apparent that various aspects may be practiced without these specific details. The figures and description are not intended to be restrictive.

The ensuing description provides example aspects, and is not intended to limit the scope, applicability, or configuration of the disclosure. Rather, the ensuing description of the example aspects will provide those skilled in the art with an enabling description for implementing an example aspect. It should be understood that various changes may be made in the function and arrangement of elements without departing from the scope of the application as set forth in the appended claims.

As noted above, machine learning systems (e.g., neural network systems or models) can be used to perform a variety of tasks such as, for example and without limitation, detection and/or recognition (e.g., scene or object detection and/or recognition, face detection and/or recognition, etc.), depth estimation, pose estimation, image reconstruction, classification, three-dimensional (3D) modeling, dense regression tasks, data compression and/or decompression, and image processing, among other tasks. Moreover, machine learning models can be versatile and can achieve high quality results in a variety of tasks.

In some cases, a machine learning system can be implemented based on performing a plurality of convolution operations (e.g., using one or more convolutional layers). A convolution is an operation on two functions that produces a third function that expresses how the shape of one is modified by the other. Machine learning networks can perform convolutional operations using a convolution kernel or filters that slide along input features to generate a plurality of feature maps. Convolutional operations can be implemented based on the hierarchical nature of the data being processed. For example, instead of processing an entire image or input at once, a convolutional neural network (CNN) breaks the image down into smaller, simpler features, which are represented by filters that are applied to different regions of the image to extract the relevant information (e.g., corresponding feature maps for the different image regions). As the CNN progresses through its convolutional layers, the features maps are combined and assembled into increasingly complex structures that are used to learn increasingly abstract representations of the input.

Machine learning networks and/or models may utilize and process a large quantity of numerical values during operations such as training, inference, etc. For example, a machine learning model can be associated with a plurality of different weight values, output values, activation values, etc. Weight values are applied to the inputs of a corresponding neuron or layer of the model. Activation values may comprise the output of a first ML layer (e.g., the input to a second ML layer). In some cases, data processing operations performed using a machine learning network can increase in computational complexity as the number of hidden layers increases, as the number of nodes or activation functions increases, and/or as the number of connections between nodes or layers increases. For example, a node (e.g., neuron) in a neural network can apply an activation function to a group of weighted inputs, and return an output generated by the activation function. A hidden layer can include one or more nodes. An increase in the number of hidden layers or nodes can cause an increase in the computational complexity of a data processing machine learning network, based on a greater number of mathematical operations being performed for each image that is processed.

An increase in the number of hidden layers or nodes can also cause an increase in the size of a data processing machine learning network. For example, the activation functions and weights associated with a neural network can each be associated with one or more numerical values (e.g., a numerical weight value, a numerical activation value representing an input or output of an activation function, a numerical value included in a lookup table used to implement a quantized activation function, etc.) used to apply the activation function or weight. Activation functions can be implemented as rectified linear activation functions (ReLUs), sigmoid activation functions, hyperbolic tangent activation functions (tanh), among various others. One or more numerical values can be used to define a respective activation function. As the number of hidden layers or nodes of a machine learning network increases, the number (e.g., quantity) of numerical values that are stored and applied in association with the machine learning network also increases.

In some examples, a processor (e.g., a Neural Processing Unit (NPU), Digital Signal Processor (DSP), and/or other processor) can be used to perform processing and/or computation operations associated with implementing an ML model. For example, an NPU can perform the processing and/or computation operations based on the weight values, output values, activation values, etc., associated with the ML model. Reducing the size of the weight values, output values, activation values, etc., can improve the efficiency of the NPU. For instance, with a reduced parameter size for ML models, a system-on-a-chip (SOC) area associated with the NPU can be reduced, a power consumption of the NPU can be reduced, a power efficiency of the NPU can be increased, a computational performance or efficiency of the NPU can be increased, etc.

Reducing the size of the numerical parameter values utilized by an ML model can also be referred to as reducing the size of the ML model. A reduced ML model size can be associated with a reduced bandwidth utilized per inference. Additionally, a smaller buffer size can reduce the on/off chip cache or other memory size requirement(s). In some aspects, the inference performance of an ML model can be improved by reducing the size of the ML model, as multiple operations and/or layers associated with the ML model may be bandwidth bounded. A reduced bandwidth corresponding to implementing a reduced size ML model can further be associated with reduced power consumption, as noted above. Reduced power consumption may allow higher computational or ML model performance within a fixed power budget.

Reducing the size of ML parameters such as weight values, output values, activation values, etc., can be based on reducing the number of bytes used to store each piece of information. For example, ML parameters such as weights, outputs, activations, etc., can be compressed to reduce the number of bytes used to store or represent the underlying (e.g., uncompressed) values. Reducing the size of ML parameters, for instance based on compressing some or all of the ML parameters, can allow faster data fetches to be performed. For instance, a 20-40% compression (e.g., reduction in size) may correspond to a 20-40% increase in data fetch speeds. Faster data fetching can additionally contribute to an increased ML network throughput.

Figure 3:
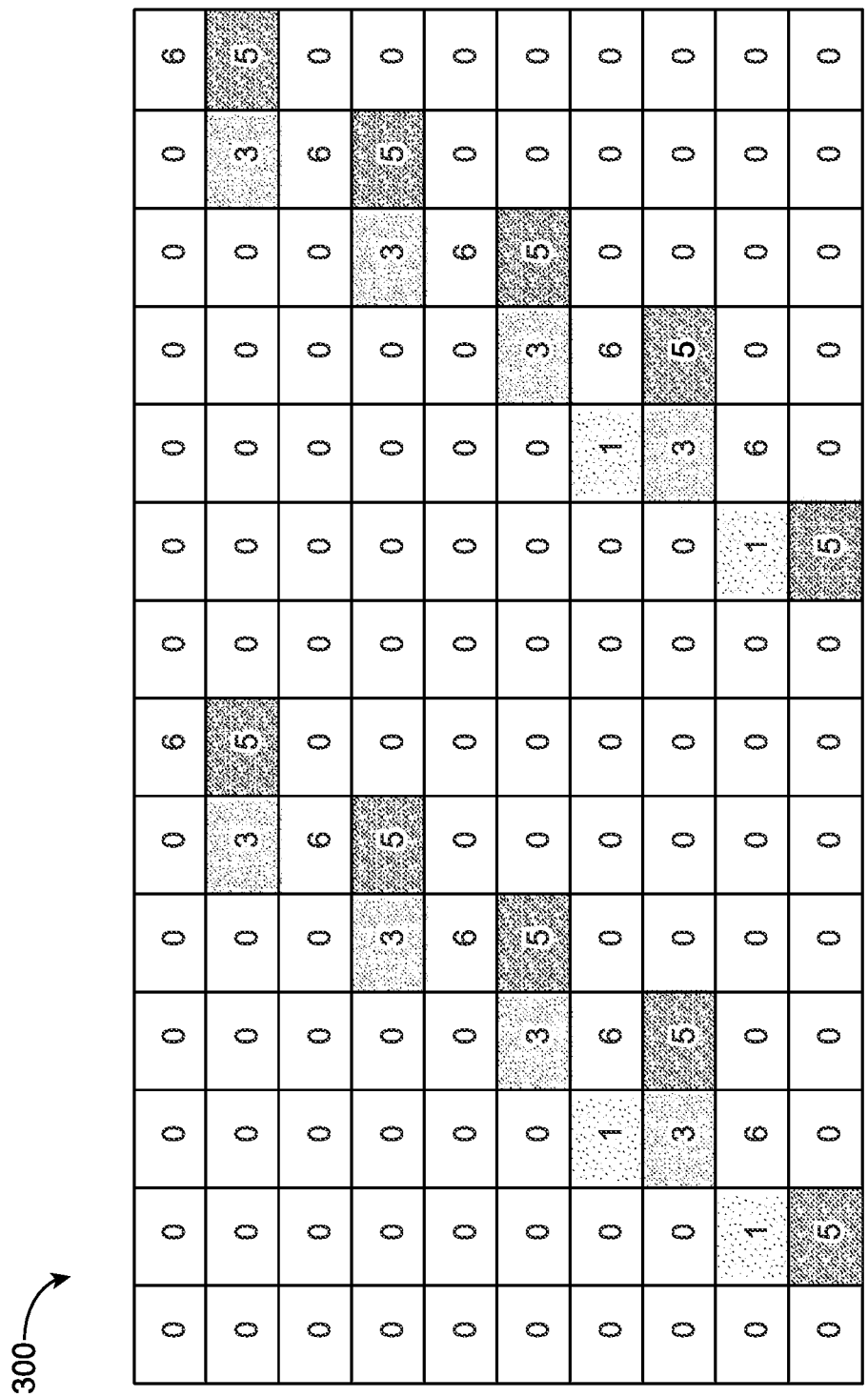
FIG. 3 illustrates an example of a neural network output with a first sparsity value of 'O' and a second sparsity value of '6', in accordance with some examples.

In some examples, ML parameter values can be compressed based on sparsity. Sparsity can refer to a set of numbers that includes many zeros or other repeated values (e.g., the repeated value(s) can be any number(s), with 0 being an example of a commonly repeated value). For example, neural networks (e.g., among various other types of ML networks) can implement data processing operations that include a plurality of sparse values, based on activations and/or outputs of the neural network including many repeated values such as zero, etc. Repeated values can be referred to as "sparsity values" or "sparse values." For instance, FIG. 3 illustrates an example neural network edge detection output 300 where two edges are detected. In the example of FIG. 3, the majority of the data values are either '0' or '6' (e.g., with the presence of the repeated 6's based on the use of a ReLU6 activation function that clips all values greater than or equal to 6). In the example neural network edge detection output 300, '0' represents a first sparsity value for the data and '6' represents a second sparsity value for the data. Additional sparsity values beyond the first and second sparsity values may be present, based on the decreasing order of frequency of occurrence (e.g., a third sparsity value for the data in FIG. 3 may be the value '5,' a fourth sparsity value may be the value '3,' etc.). In some aspects, only '0' and '6' may be used as sparsity values for the example of ReLU6 activation function clipped data shown in FIG. 3 (e.g., as repeated values of '0' and '6' are expected with the ReLU6 activation function).

In many examples, sparsity can be present based on a sparsity value of '0.' For instance, in the example neural network edge detection output 300, many locations have a value of '0,' and correspond to locations where feature extraction did not detect activity. A sparsity value of '0' can be present based on the machine learning network being trained toward zero, where a return value of '0' is used to indicate a negative result (or lack of result). For example, values of '0' are widely expected with Rectified Linear Unit (ReLU) and Parametric ReLU (PReLU) activation functions, among various others.

Sparsity can be present based on sparsity values other than '0.' For instance, the ReLU6 activation function produces outputs where the majority of the data has a value of '0' or '6,' based on ReLU6 clipping all values below a first threshold to '0' and all values above a second threshold to '6.' For instance, the example neural network edge detection feature output 300 can be associated with and/or generated using a ReLU6 activation function, which corresponds to the presence of the first and second sparsity values of '0' and '6,' respectively. In some examples, weight sparsity can be used. For instance, pruning can be used to remove weights that have less impact on the calculation. The pruning increases the sparsity of the data and can reduce the weight size. Various different pruning techniques can be used to provide random sparsity or structured sparsity.

There is a need for improved sparsity compression to achieve smaller machine learning network model sizes. There is a further need for improved sparsity compression that can be used to reduce overall bandwidth requirements and/or bandwidth usage associated with implementing machine learning networks. There is additionally a further need for improved sparsity compression that can be used to increase the speed of inference of machine learning models while achieving higher performance with lower power consumption.

Systems, apparatuses, processes (also referred to as methods), and computer-readable media (collectively referred to as "systems and techniques") are described herein for data compression. In some aspects, the systems and techniques can be used to perform data compression based on sparsity information of the data being compressed. In some cases, the systems and techniques can be used to perform universal bit-field masking coding (UBFMC). UBFMC can be used to reduce the size of (e.g., to compress) activations (e.g., NPU activations), parameters of a machine learning model (e.g., weights, biases, etc. of a neural network model), outputs, etc. In some examples, the reduced size of the activations, parameters, and/or outputs associated with performing UBFMC-based data compression can reduce an SoC area associated with implementing a machine learning model (e.g., a neural network model), can reduce the power consumption associated with implementing a machine learning model, and/or can improve the computational performance associated with implementing the machine learning model. The reduced model size associated with the UBFMC-based data compression can additionally reduce the bandwidth per inference and/or a buffer size associated with implementing a machine learning model. In some aspects, a smaller buffer size can correspond to a reduction in the memory size (e.g., the cache, Double Data Rate (DDR) memory, and/or flash memory size) needed to implement the machine learning model. In some cases, inference performance may additionally be improved for machine learning networks that include one or more operations and/or layers that are bandwidth bounded. As noted above, the UBFMC-based data compression can be associated with reduce power consumption, for instance based on the reduced bandwidth per inference. In some aspects, a reduced power consumption can correspond to improved (e.g., greater) computational performance within a fixed power budget.

In some examples, the systems and techniques described herein can be used to implement UBFMC that can be used to perform compression for machine learning data and/or machine learning parameters with sparsity (e.g., that include one or more sparsity values). In some examples, the sparsity compression based on UBFMC is lossless compression that is bit-accurate before and after compression (e.g., the original uncompressed data can be recovered from the compressed data). In some examples, the UBFMC compression can support random sparsity and/or structured sparsity. For instance, the systems and techniques can perform sparsity-based and/or sparsity-aware compression for input data or data streams with random sparsity. The systems and techniques can additionally perform sparsity-based and/or sparsity-aware compression for input data or data streams with structured sparsity (e.g., non-random sparsity). In some cases, random sparsity may occur when a sparsity value (e.g., 0) occurs at random locations within the data. Structured sparsity may occur when a relationship exists between the quantity and/or locations of the sparsity value occurrences within the data (e.g., every two out of four values are the sparsity value '0,' etc.).

In some aspects, the systems and techniques can be used to implement UBFMC-based data compression with a reduced header overhead associated with the compression header (e.g., carrying metadata or other information indicative of the compression applied, for use in decompression). For instance, the systems and techniques can perform UBFMC-based data compression based on using a two-stage header indicative of the compression applied. In some examples, in addition to the two-stage header, a global header can be used to indicate one or more sparsity values that can be used to perform sparsity compression (e.g., that can be used to perform UBFMC).

In some examples, a two-stage header can be generated for each 32 byte (32B) packet of the uncompressed data. The 32B data packet can include four subpackets, with one subpacket for each 8B of uncompressed data. The systems and techniques can support 4-bit packing, 8-bit packing, 16-bit packing, etc. The bit packing can be based on the bit-size of the machine learning (ML) parameters or values that are being compressed. For instance, in 4-bit packing, each ML parameter/value is 4 bits in size, and each 8B subpacket includes (8/4)*8=16 data values. In 8-bit packing, each ML parameter/value is 8 bits in size, and each 8B subpacket includes (8/8)*8=8 data values. In 16-bit packing, each ML parameter/value is 16 bits in size. In some aspects, each subpacket can be generated to include 8 16-bit data values, for a subpacket size of 16 bytes (16B) (e.g., 16 bits*8=128 bits; 128 bits/(8 bits/byte)=16 bytes. In 16-bit packing, each 32B packet can include two 16B subpackets.

In some cases, the first stage packet header can use one byte (e.g., bits 0-7) to indicate packet encoding information and to indicate the subpacket header coding information and/or a configured sparsity value. The subpacket header can refer to the second stage packet header. The second stage packet header can include up to four subpacket headers on one byte each (e.g., the second stage packet header can use between 0 and 4 bytes, corresponding to the second stage packet header including between 0 and 4 subpacket headers). The second stage packet header/the individual subpacket headers can be used to indicate the sparsity locations within each subpacket where a sparsity value is present or located.

Various aspects of the present disclosure will be described with respect to the figures.

FIG. 1 illustrates an example implementation of a system-on-a-chip (SOC) 100, which may include a central processing unit (CPU) 102 or a multi-core CPU, configured to perform one or more of the functions described herein. Parameters or variables (e.g., neural signals and synaptic weights), system parameters associated with a computational device (e.g., neural network with weights), delays, frequency bin information, task information, among other information may be stored in a memory block associated with a neural processing unit (NPU) 108, in a memory block associated with a CPU 102, in a memory block associated with a graphics processing unit (GPU) 104, in a memory block associated with a digital signal processor (DSP) 106, in a memory block 118, and/or may be distributed across multiple blocks. Instructions executed at the CPU 102 may be loaded from a program memory associated with the CPU 102 or may be loaded from a memory block 118.

The SOC 100 may also include additional processing blocks tailored to specific functions, such as a GPU 104, a DSP 106, a connectivity block 110, which may include fifth generation (5G) connectivity, fourth generation long term evolution (4G LTE) connectivity, Wi-Fi connectivity, USB connectivity, Bluetooth connectivity, and the like, and a multimedia processor 112 that may, for example, detect and recognize gestures. In some implementations, the NPU is implemented in the CPU 102, DSP 106, and/or GPU 104. The SOC 100 may also include one or more sensors 114, image signal processors (ISPs) 116, and/or storage 120.

The SOC 100 may be based on an ARM, a RISC-V, or any reduced instruction set. In an aspect of the present disclosure, the instructions loaded into the CPU 102 may comprise code to search for a stored multiplication result in a lookup table (LUT) corresponding to a multiplication product of an input value and a filter weight. The instructions loaded into the CPU 102 may also comprise code to disable a multiplier during a multiplication operation of the multiplication product when a lookup table hit of the multiplication product is detected. In addition, the instructions loaded into the CPU 102 may comprise code to store a computed multiplication product of the input value and the filter weight when a lookup table miss of the multiplication product is detected.

SOC 100 and/or components thereof may be configured to perform image processing using machine learning techniques according to aspects of the present disclosure discussed herein. For example, SOC 100 and/or components thereof may be configured to perform disparity estimation refinement for pairs of images (e.g., stereo image pairs, each including a left image and a right image). SOC 100 can be part of a computing device or multiple computing devices.

In some examples, SOC 100 can be part of an electronic device (or devices) such as a camera system (e.g., a digital camera, an IP camera, a video camera, a security camera, etc.), a telephone system (e.g., a smartphone, a cellular telephone, a conferencing system, etc.), a desktop computer, an XR device (e.g., a head-mounted display, etc.), a smart wearable device (e.g., a smart watch, smart glasses, etc.), a laptop or notebook computer, a tablet computer, a set-top box, a television, a display device, a system-on-chip (SoC), a digital media player, a gaming console, a video streaming device, a server, a drone, a computer in a car, an Internet-of-Things (IoT) device, or any other suitable electronic device(s).

In some implementations, the CPU 102, the GPU 104, the DSP 106, the NPU 108, the connectivity block 110, the multimedia processor 112, the one or more sensors 114, the ISPs 116, the memory block 118 and/or the storage 120 can be part of the same computing device. For example, in some cases, the CPU 102, the GPU 104, the DSP 106, the NPU 108, the connectivity block 110, the multimedia processor 112, the one or more sensors 114, the ISPs 116, the memory block 118 and/or the storage 120 can be integrated into a smartphone, laptop, tablet computer, smart wearable device, video gaming system, server, and/or any other computing device. In other implementations, the CPU 102, the GPU 104, the DSP 106, the NPU 108, the connectivity block 110, the multimedia processor 112, the one or more sensors 114, the ISPs 116, the memory block 118 and/or the storage 120 can be part of two or more separate computing devices.

Machine learning (ML) can be considered a subset of artificial intelligence (AI). ML systems can include algorithms and statistical models that computer systems can use to perform various tasks by relying on patterns and inference, without the use of explicit instructions. An example of a ML system is a neural network (also referred to as an artificial neural network), which may include an interconnected group of artificial neurons (e.g., neuron models). Neural networks may be used for various applications and/or devices, such as image and/or video coding, image analysis and/or computer vision applications, Internet Protocol (IP) cameras, Internet of Things (IoT) devices, autonomous vehicles, service robots, among others.

Individual nodes in a neural network may emulate biological neurons by taking input data and performing simple operations on the data. The results of the simple operations performed on the input data are selectively passed on to other neurons. Weight values are associated with each vector and node in the network, and these values constrain how input data is related to output data. For example, the input data of each node may be multiplied by a corresponding weight value, and the products may be summed. The sum of the products may be adjusted by an optional bias, and an activation function may be applied to the result, yielding the node's output signal or "output activation" (sometimes referred to as a feature map or an activation map). The weight values may initially be determined by an iterative flow of training data through the network (e.g., weight values are established during a training phase in which the network learns how to identify particular classes by their typical input data characteristics).

Different types of neural networks exist, such as convolutional neural networks (CNNs), recurrent neural networks (RNNs), generative adversarial networks (GANs), multi-layer perceptron (MLP) neural networks, transformer neural networks, among others. For instance, convolutional neural networks (CNNs) are a type of feed-forward artificial neural network. Convolutional neural networks may include collections of artificial neurons that each have a receptive field (e.g., a spatially localized region of an input space) and that collectively tile an input space. RNNs work on the principle of saving the output of a layer and feeding this output back to the input to help in predicting an outcome of the layer. A GAN is a form of generative neural network that can learn patterns in input data so that the neural network model can generate new synthetic outputs that reasonably could have been from the original dataset. A GAN can include two neural networks that operate together, including a generative neural network that generates a synthesized output and a discriminative neural network that evaluates the output for authenticity. In MLP neural networks, data may be fed into an input layer, and one or more hidden layers provide levels of abstraction to the data. Predictions may then be made on an output layer based on the abstracted data.

Deep learning (DL) is an example of a machine learning technique and can be considered a subset of ML. Many DL approaches are based on a neural network, such as an RNN or a CNN, and utilize multiple layers. The use of multiple layers in deep neural networks can permit progressively higher-level features to be extracted from a given input of raw data. For example, the output of a first layer of artificial neurons becomes an input to a second layer of artificial neurons, the output of a second layer of artificial neurons becomes an input to a third layer of artificial neurons, and so on. Layers that are located between the input and output of the overall deep neural network are often referred to as hidden layers. The hidden layers learn (e.g., are trained) to transform an intermediate input from a preceding layer into a slightly more abstract and composite representation that can be provided to a subsequent layer, until a final or desired representation is obtained as the final output of the deep neural network.

As noted above, a neural network is an example of a machine learning system, and can include an input layer, one or more hidden layers, and an output layer. Data is provided from input nodes of the input layer, processing is performed by hidden nodes of the one or more hidden layers, and an output is produced through output nodes of the output layer. Deep learning networks typically include multiple hidden layers. Each layer of the neural network can include feature maps or activation maps that can include artificial neurons (or nodes). A feature map can include a filter, a kernel, or the like. The nodes can include one or more weights used to indicate an importance of the nodes of one or more of the layers. In some cases, a deep learning network can have a series of many hidden layers, with early layers being used to determine simple and low-level characteristics of an input, and later layers building up a hierarchy of more complex and abstract characteristics.

A deep learning architecture may learn a hierarchy of features. If presented with visual data, for example, the first layer may learn to recognize relatively simple features, such as edges, in the input stream. In another example, if presented with auditory data, the first layer may learn to recognize spectral power in specific frequencies. The second layer, taking the output of the first layer as input, may learn to recognize combinations of features, such as simple shapes for visual data or combinations of sounds for auditory data. For instance, higher layers may learn to represent complex shapes in visual data or words in auditory data. Still higher layers may learn to recognize common visual objects or spoken phrases. Deep learning architectures may perform especially well when applied to problems that have a natural hierarchical structure. For example, the classification of motorized vehicles may benefit from first learning to recognize wheels, windshields, and other features. These features may be combined at higher layers in different ways to recognize cars, trucks, and airplanes.

Neural networks may be designed with a variety of connectivity patterns. In feed-forward networks, information is passed from lower to higher layers, with each neuron in a given layer communicating to neurons in higher layers. A hierarchical representation may be built up in successive layers of a feed-forward network, as described above. Neural networks may also have recurrent or feedback (also called top-down) connections. In a recurrent connection, the output from a neuron in a given layer may be communicated to another neuron in the same layer. A recurrent architecture may be helpful in recognizing patterns that span more than one of the input data chunks that are delivered to the neural network in a sequence. A connection from a neuron in a given layer to a neuron in a lower layer is called a feedback (or top-down) connection. A network with many feedback connections may be helpful when the recognition of a high-level concept may aid in discriminating the particular low-level features of an input.

Figure 2A:
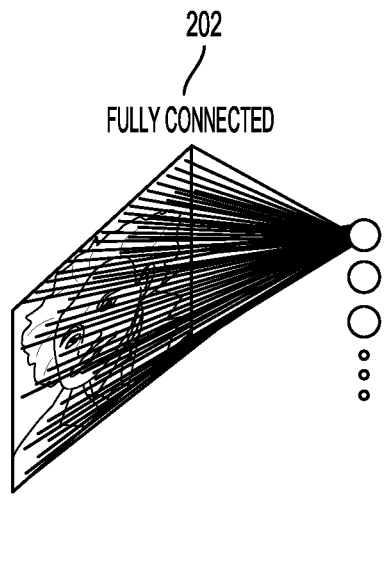
FIG. 2A illustrates an example of a fully connected neural network, in accordance with some examples.
Figure 2B:
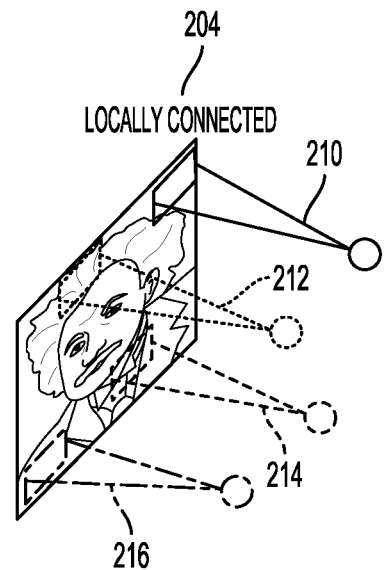
FIG. 2B illustrates an example of a locally connected neural network, in accordance with some examples.

The connections between layers of a neural network may be fully connected or locally connected. FIG. 2A illustrates an example of a fully connected neural network 202. In a fully connected neural network 202, a neuron in a first hidden layer may communicate its output to every neuron in a second hidden layer, so that each neuron in the second layer will receive input from every neuron in the first layer. FIG. 2B illustrates an example of a locally connected neural network 204. In a locally connected neural network 204, a neuron in a first hidden layer may be connected to a limited number of neurons in a second hidden layer. More generally, a locally connected layer of the locally connected neural network 204 may be configured so that each neuron in a layer will have the same or a similar connectivity pattern, but with connections strengths that may have different values (e.g., 210, 212, 214, and 216). The locally connected connectivity pattern may give rise to spatially distinct receptive fields in a higher layer, because the higher layer neurons in a given region may receive inputs that are tuned through training to the properties of a restricted portion of the total input to the network.

Figure 2C:
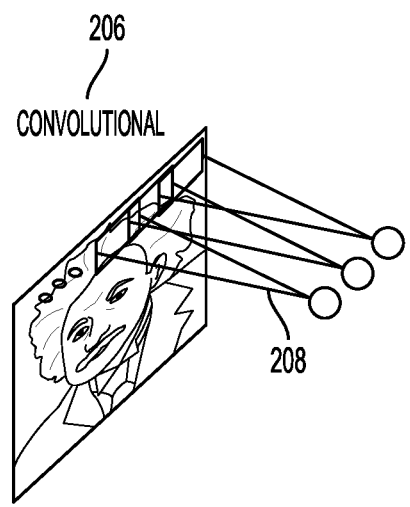
FIG. 2C illustrates an example of a convolutional neural network, in accordance with some examples.

An example of a locally connected neural network is a convolutional neural network. FIG. 2C illustrates an example of a convolutional neural network 206. The convolutional neural network 206 may be configured such that the connection strengths associated with the inputs for each neuron in the second layer are shared (e.g., 208). Convolutional neural networks may be well suited to problems in which the spatial location of inputs is meaningful. Convolutional neural network 206 may be used to perform one or more aspects of video compression and/or decompression, according to aspects of the present disclosure. An example of a deep learning network is described in greater depth with respect to the example block diagram of FIG. 8. An example of a convolutional neural network is described in greater depth with respect to the example block diagram of FIG. 9.

As mentioned previously, systems and techniques are described herein for data compression. In some aspects, the systems and techniques can be used to perform data compression based on sparsity information of the data being compressed. In some cases, the systems and techniques can be used to perform universal bit-field masking coding (UBFMC). UBFMC can be used to reduce the size of (e.g., to compress) neural network processor (NPU) activations, weights, outputs, etc. For instance, UBFMC can be used to perform compression for machine learning data and/or machine learning parameters with sparsity (e.g., including one or more sparsity values). In some aspects, the activations and/or outputs associated with a machine learning neural network may include one or more sparsity values, where each sparsity value is a value included multiple or repeated times in the neural network activations and/or outputs.

In some cases, the systems and techniques can be used to perform data compression of ML parameter values and/or outputs, based on respective sparsity information corresponding to the ML parameter values and/or outputs. Sparsity can refer to a set of numbers that includes many zeros or other repeated values. For example, neural networks (e.g., among various other types of ML networks) can implement data processing operations that include a plurality of sparse values, based on activations and/or outputs of the neural network including many repeated values such as zero, etc. Repeated values can be referred to as "sparsity values" or "sparse values." Random sparsity may occur when a sparsity value (e.g., 0) occurs at random locations within the data. Structured sparsity may occur when a relationship exists between the quantity and/or locations of the sparsity value occurrences within the data (e.g., every two out of four values are the sparsity value '0,' etc.).

For instance, FIG. 3 illustrates an example neural network edge detection output 300 where two edges are detected. In the example of FIG. 3, the majority of the data values are either '0' or '6' (e.g., with the presence of the repeated 6's based on the use of a ReLU6 activation function that clips all values greater than or equal to 6). In the example neural network edge detection output 300, '0' represents a first sparsity value for the data and '6' represents a second sparsity value for the data. In many examples, sparsity can be present based on a sparsity value of '0.' For instance, in the example neural network edge detection output 300, many locations have a value of '0,' and correspond to locations where feature extraction did not detect activity. A sparsity value of '0' can be present based on the machine learning network being trained toward zero, where a return value of '0' is used to indicate a negative result (or lack of result). For example, values of '0' are widely expected with Rectified Linear Unit (ReLU) and Parametric ReLU (PReLU) activation functions, among various others.

Sparsity can be present based on sparsity values other than '0.' For instance, the ReLU6 activation function produces outputs where the majority of the data has a value of '0' or '6,' based on ReLU6 clipping all values below a first threshold to '0' and all values above a second threshold to '6.' For instance, the example neural network edge detection feature output 300 can be associated with and/or generated using a ReLU6 activation function, which corresponds to the presence of the first and second sparsity values of '0' and '6,' respectively. In some examples, weight sparsity can be used. For instance, pruning can be used to remove weights that have less impact on the calculation. The pruning increases the sparsity of the data and can reduce the weight size. Various different pruning techniques can be used to provide random sparsity or structured sparsity.

In some examples, the systems and techniques can perform sparsity-based data compression (e.g., UBFMC) that is lossless. For instance, the systems and techniques can perform bit-accurate compression based on sparsity information, where the original (uncompressed) data can be fully recovered after the compression without any bit loss or bit errors. The systems and techniques can perform sparsity-based data compression based on random sparsity and/or based on structured sparsity.

UBFMC can additionally reduce a header overhead associated with the compression header (e.g., carrying metadata or other information indicative of the compression applied, for use in decompression). For instance, UBFMC can reduce compression overhead based on using a two-stage header, as will be described below. In addition to the two-stage header, a global header can be used to indicate one or more configured sparsity values that can be used to perform sparsity compression (e.g., that can be used to perform UBFMC). For instance, a configured sparsity value of '0' can indicate that '0' is the most frequently occurring sparsity value included in the input data (e.g., uncompressed data). An additional configured sparsity value (e.g., of '6') can indicate that '6' is the second most frequently occurring sparsity value included in the input data.

A two-stage header can be generated for each 32 byte (32B) packet of the uncompressed data. The 32B data packet can include four subpackets, with one subpacket for each 8B of uncompressed data. The systems and techniques can support 4-bit packing, 8-bit packing, 16-bit packing, etc. The bit packing is based on the bit-size of the ML parameters or values that are being compressed. For instance, in 4-bit packing, each ML parameter/value is 4 bits in size, and each 8B subpacket includes (8/4)*8=16 data values. In 8-bit packing, each ML parameter/value is 8 bits in size, and each 8B subpacket includes (8/8)*8=8 data values. In 16-bit packing, each ML parameter/value is 16 bits in size. In some aspects, each subpacket can be generated to include 8 16-bit data values, for a subpacket size of 16 bytes (16B) (e.g., 16 bits*8=128 bits; 128 bits/(8 bits/byte)=16 bytes. In 16-bit packing, each 32B packet can include two 16B subpackets.

The systems and techniques can utilize a two-stage packet header indicative of the compression applied to a respective data packet, as will be described below with reference to at least FIGS. 5-9. The first stage packet header can use one byte (e.g., bits 0-7) to indicate packet encoding information and to indicate the subpacket header coding information. The subpacket header can be included in the second stage packet header. The second stage packet header can include up to four subpacket headers on (e.g., of) one byte each (e.g., the second stage packet header can use between 0 and 4 bytes, corresponding to the second stage packet header including between 0 and 4 subpacket headers). The second stage packet header/the individual subpacket headers can be used to indicate the sparsity locations within each subpacket.

As noted previously above, the systems and techniques can perform data compression based on a 32-byte (32B) packet size. Each 32B packet can include four 8-byte (8B) sub-packets. In some aspects, each 32B data packet can be compressed individually. For instance, the systems and techniques can perform parallel compression for a plurality of 32B data packets. Packet decoding can be performed in parallel, and packet decoding for a current packet can begin once the previous packet header is decoded.

Figure 4:
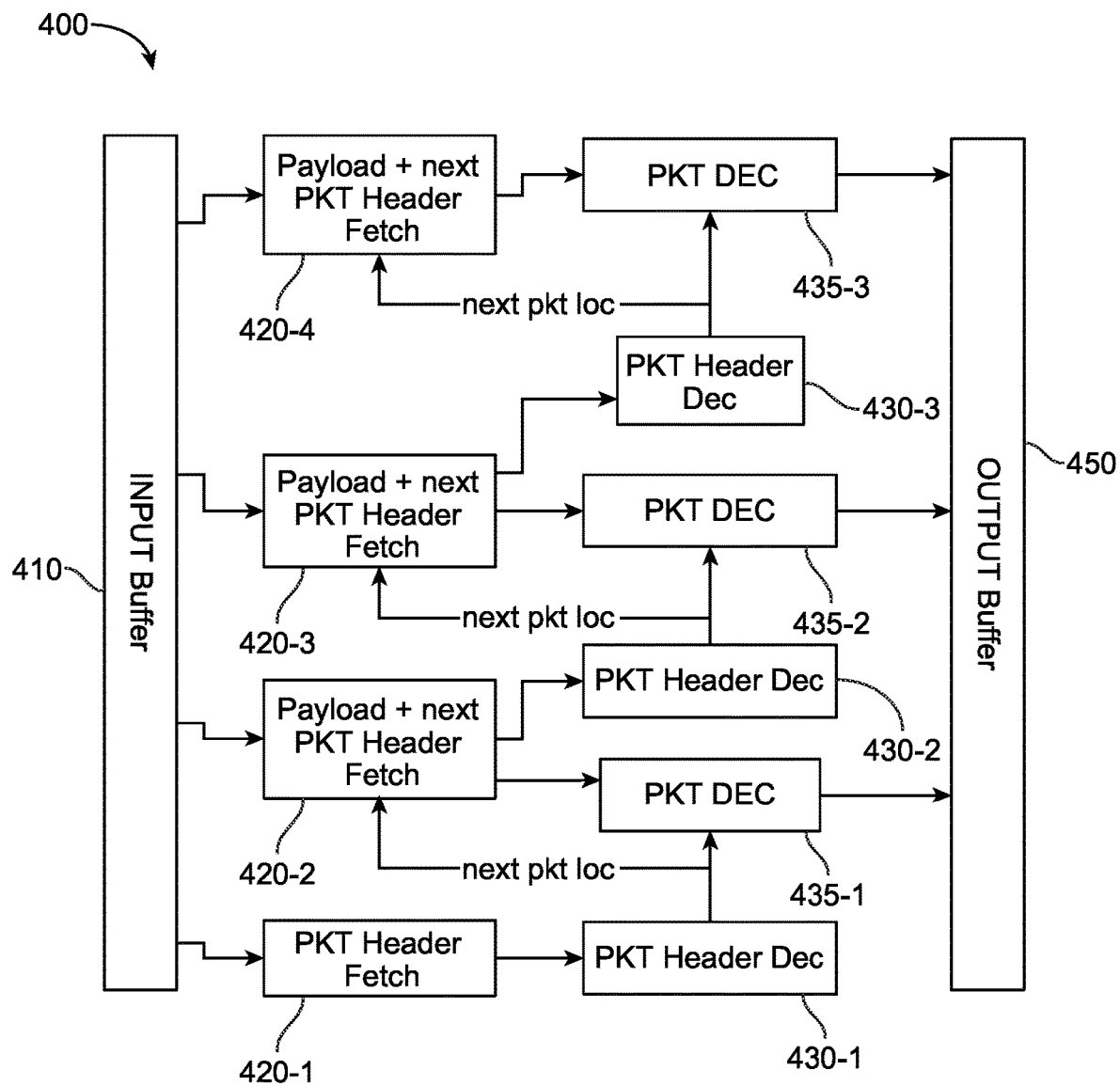
FIG. 4 illustrates an example computing architecture for universal bit-field masking coding (UBFMC) parallel encoding and decoding, in accordance with some examples.

For instance, FIG. 4 illustrates an example computing architecture 400 that can be used to perform universal bit-field masking coding (UBFMC) parallel decoding, in accordance with some examples. An input buffer 410 can receive and store one or more UBFMC coded packets (e.g., UBFMC compressed packets). Each UBFMC compressed packet can correspond to 32B of uncompressed data (e.g., also referred to as input data). Each UBFMC can include a two-stage packet header.

In some aspects, the computing architecture 400 can include a packet (PKT) header fetch engine 420-1, a second payload and header fetch engine 420-2, a third payload and header fetch engine 420-3, and a fourth payload and header fetch engine 420-4. In some examples, the packet header fetch engine 420-1 can be the same as or similar to the payload and header fetch engines 420-2-420-4.

The packet header fetch engine 420-1 can fetch, from the input buffer 410, information corresponding to a first packet header to be decoded. The first packet header information can be provided to a corresponding first packet header decoding engine 430-1.

The first packet header decoding engine 430-1 can decode the information corresponding to the first packet header, and can provide the decoded information to a first packet decoding engine 435-1. The first packet header decoding engine 430-1 can additionally provide the next packet location to the second payload and header fetch engine 420-2. For instance, the next packet location can be included in the packet header information decoded by the first packet header decoding engine 430-1 (e.g., the packet header corresponding to packet t is indicative of the next packet location corresponding to packet t+1).

The second payload and header fetch engine 420-2 can use the packet location information from the first packet header decoding engine 430-1 to fetch, from the input buffer 410, the corresponding payload information of the first compressed packet. The payload information of the first compressed packet can be provided to the first packet decoding engine 435-1, which can decompress the first compressed packet and output the first packet to the output buffer 450. The first compressed packet can be decompressed based on the payload information received by the first packet decoding engine 435-1 from the second payload and header fetch engine 420-2 and based on the packet header information from the first packet header decoding engine 430-1.

The second payload and header fetch engine 420-2 can additionally fetch, from the input buffer 410, the second packet header information. The second packet header information can be provided to the second packet header decoding engine 430-2. The second packet header decoding engine 430-2 can provide the decoded second packet header to the second packet decoding engine 435-2 and can provide the next packet location (e.g., third packet location) to the third payload and header fetch engine 420-3. The third payload and header fetch engine 420-3 can fetch, from the input buffer 410, the second packet payload information (e.g., which is then provided to the second packet decoding engine 435-2) and the next packet header (e.g., third packet header) which is then provided to the third packet header decoding engine 430-3. The second packet decoding engine 435-2 can decode (e.g., decompress) the compressed payload of the second packet received from the third payload and header fetching engine 420-3, and can write the decompressed second packet to the output buffer 450. The third packet header decoding engine 430-3 can decode the third packet header received from the second payload and header fetch engine 420-3, and can provide the decoded third packet header information to the third packet decoding engine 435-3 and can provide the next packet location (e.g., fourth packet location) to the fourth payload and header fetch engine 420-4. The fourth payload and header fetch engine 420-4 can provide the third packet compressed payload to the third packet decoding engine 435-3. The third packet decoding engine 435-3 can decode the third packet compressed payload and can write the decoded (e.g., decompressed) third packet to the output buffer 450.

In some aspects, a UBFMC encoder can implement weight compression offline. In some examples, a UBFMC encoder can additionally perform activation output on the fly. In some cases, a UBFMC decoder (e.g., a UBFMC decoder such as the computing architecture 400 of FIG. 4) can be used to implement one or more (or both) of weight decompression on the fly and/or activation decompression on the fly.

Figure 5:
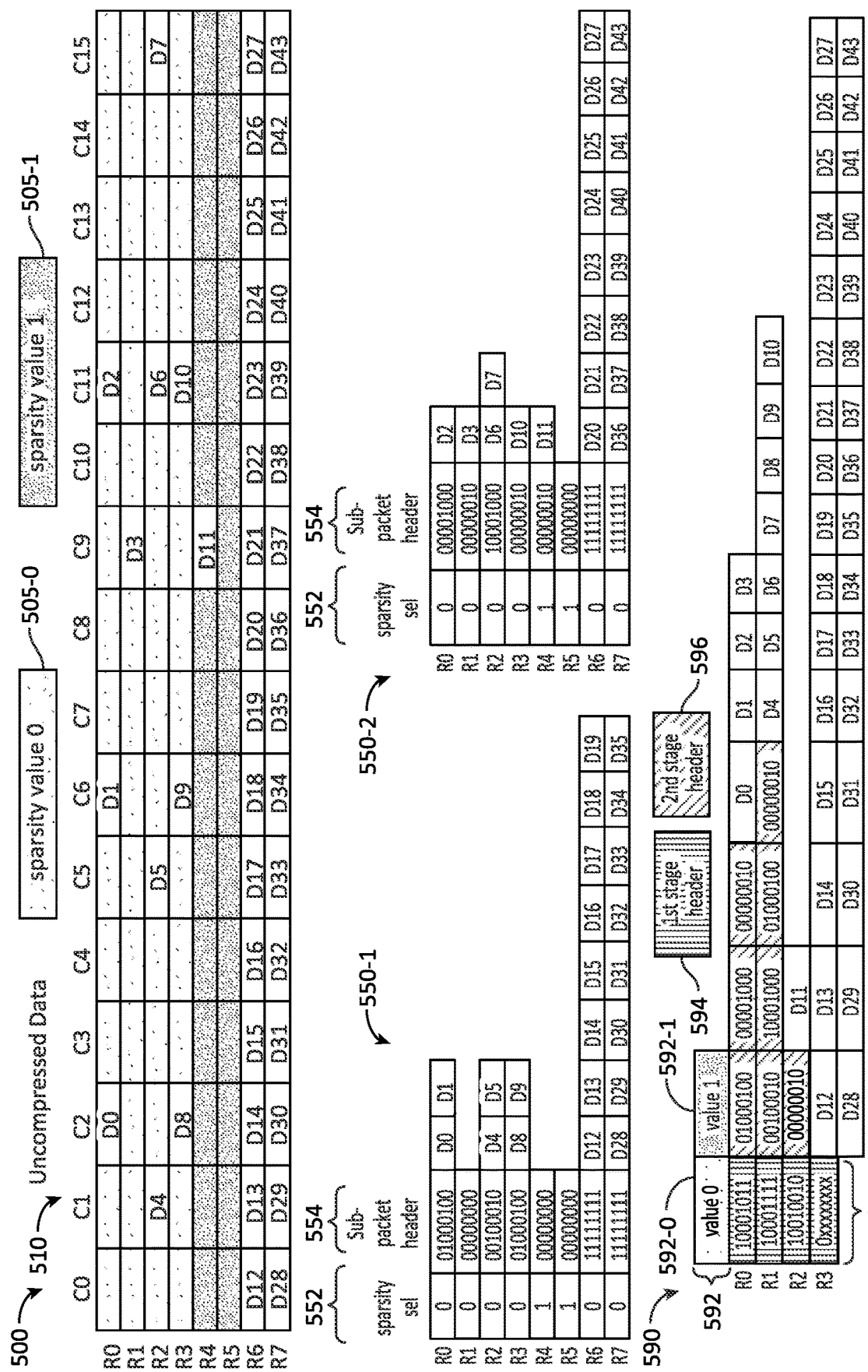
FIG. 5 illustrates an example of sub-packet compression using a two-stage packet header and 8-bit data packing, in accordance with some examples.

FIG. 5 illustrates an example of sub-packet compression 500 using a two-stage packet header and 8-bit data packing, in accordance with some examples. For instance, sub-packet compression 500 can be implemented based on using UBFMC to generate compressed packet data 590 corresponding to input (e.g., uncompressed) packet data 510. In some aspects, the sub-packet compression 500 may also be referred to as UBFMC-based sparsity compression. For instance, the sub-packet compression 500 can be implemented as UBFMC-based sparsity compression using 8-bit packing.

In some aspects, the uncompressed data 510 corresponds to an input of 128-bytes (128B) of original (e.g., uncompressed) data. For instance, the uncompressed data 510 comprises 8 rows ("0"–"7") of 16-bytes (16B) each. The uncompressed data 510 includes 128 1-byte (1B) entries, each represented as an individual box within the 8×16 grid (e.g., 8*16=128). One byte is equal to 8 bits.

A first subset of the uncompressed data 510 has a value equal to a first configured sparsity value 505-0 (e.g., the "sparsity value 0"). A second subset of the uncompressed data 510 has a value equal to a second configured sparsity value 505-1 (e.g., the sparsity value 1"). The first and second sparsity values 505-0 and 505-1, respectively, can be equal to any number or value that is included in the uncompressed data 510. The first and second sparsity values 505-0 and 505-1 can be integer valued and/or can be non-integer valued.

In addition to the first and second subsets of the uncompressed data 510, which have the first and second sparsity values 505-0, 505-1, respectively, the uncompressed data 510 includes a third subset of non-sparsity data. For instance, the non-sparsity data is represented with the text labels "D0," "D1," . . . , "D43" and includes a total of 44 non-sparsity data bytes. The 44 non-sparsity data bytes each have a respective value that is different from both the first sparsity value 505-0 and the second sparsity value 505-1. The non-sparsity data bytes may include repeated values or may include different values.

The sub-packet compression 500 can be implemented as UBFMC-based sparsity compression using 8-bit packing. In 8-bit packing, each data element of the uncompressed data 510 is represented on 8 bits (e.g., one byte). In some aspects, a packet size of 32B can be utilized, and each of the eight rows of the uncompressed data 510 can correspond to two 8B sub-packets. For example, the row 0 of uncompressed data 510 can correspond to a first sub-packet from 0:0 to 0:7, and a second sub-packet from 0:8 to 0:15. The row 1 of uncompressed data 510 can correspond to a first sub-packet from 1:0 to 1:7, and a second sub-packet from 1:8 to 1:15. The four sub-packets ([0:0]-[0:7]; [0:8]-[0:15]; [1:0]-[1:7]; [1:8]-[1:15]) correspond to a first 32B packet of the uncompressed data 510.

In some aspects, the systems and techniques can perform sub-packet compression for each sub-packet included in the uncompressed data 510. For example, a first sub-packet compression 550-1 can correspond to compressing the respective first sub-packet from [n:0]-[n:7] of each of the n=8 rows of the uncompressed data 510 (e.g., for rows n=0, 1, . . . , 7). A second sub-packet compression 550-2 can correspond to compressing the respective second sub-packet from [n:8]-[n:15] of each of the n=0, 1, ..., 7 rows of the uncompressed data 510.

In the first and second sub-packet compression 550-1 and 550-2, respectively, sparsity data can be removed and the remaining non-sparsity data can be packed together. For example, the uncompressed data 510 row R0, C0-C7 sequence [0 0 D0 0 0 0 D1 0] can be represented in row R0 of the first sub-packet compression 550-1 as the compressed sequence [D0 D1], which removes each occurrence of a data value equal to the sparsity value 0, and packs the remaining non-sparsity data D0 and D1 together. The uncompressed data 510 row R0, C8-C15 sequence [0 0 0 D2 0 0 0 0] can be represented in row R0 of the second sub-packet compression 550-2 as the compressed sequence [D2].

The uncompressed data 510 row R1, C0-C7 sequence [0 0 0 0 0 0 0 0] does not have a corresponding compressed sequence in row R1 of the first sub-packet compression 550-1 (or has an empty compressed sequence [ ]), based on including only the sparsity value 0. The uncompressed data 510 row R1, C8-C15 sequence [0 D3 0 0 0 0 0 0] can be represented in row R1 of the second sub-packet compression 550-2 as the compressed sequence [D3], based on removing each occurrence of a data value equal to the sparsity value 0.

Each compressed sub-packet can include a corresponding sparsity selection 552 (e.g., information indicative of the configured sparsity value used for compression of the respective sub-packet, either first sparsity value 505-0 or second sparsity value 505-1). For instance, in the uncompressed data 510, rows 0-3 (e.g., R0, R1, R2, R3) include the first sparsity value 505-0. The corresponding sparsity selection 552 for rows R0, R1, R2, R3 in the first sub-packet compression 550-1 and the second sub-packet compression 550-2 can be indicative of the first sparsity value 505-0 (e.g., a sparsity selection 552 value of '0', indicative of the "sparsity value 0" 505-0). In the uncompressed data 510, rows 4 and 5 (e.g., R4 and R5) include the second sparsity value 505-1. The corresponding sparsity selection 552 for rows R4 and R5 in the first sub-packet compression 550-1 and the second sub-packet compression 550-2 can be indicative of the second sparsity value 505-1 (e.g., a sparsity selection 552 value of '1', indicative of the "sparsity value 1" 505-1). In the uncompressed data 510, rows 6 and 7 (e.g., R6 and R7) do not include any sparsity values and are fully-packed rows. In some examples, the corresponding sparsity selection 552 for fully-packed rows R6 and R7 in the first sub-packet compression 550-1 and the second sub-packet compression 550-2 can be indicative of a global or default sparsity value, shown here as the "sparsity value 0" 505-0.

In some aspects, each compressed sub-packet of the first and second sub-packet compression 550-1 and 550-2, respectively, can further include a corresponding sub-packet header 554. The sub-packet header 554 can also be referred to as the "second header" of the two-stage packet header used to perform sparsity-based sub-packet compression. In some examples, the subpacket header 554 is generated to indicate the location of sparsity values and/or non-sparsity values within the 8-bytes of the corresponding uncompressed sun-packet data. For instance, the subpacket header 554 can be indicative of the subpacket sparsity location(s), where the configured sparsity value (e.g., indicated by the value of the corresponding sparsity selection 552 for the sub-packet) is present or located.

For example, row R0 of the uncompressed data 510 corresponds to the first subpacket values [0 0 D0 0 0 0 D1 0] and the second subpacket values [0 0 0 D2 0 0 0 0], where '0' represents the occurrence of the first sparsity value 505-0 (e.g., the configured sparsity value 0).

The first R0 sub-packet header (e.g., the sub-packet header 554 information corresponding to R0 of the first sub-packet compression 550-1) can be generated as 01000100, where a '0' indicates that the corresponding byte location in the subpacket is sparse and a '1' indicates that the corresponding byte location in the subpacket is not sparse. The left-to-right sequence of the subpacket header maps to a right-to-left encoding of the byte locations. For instance, the first R0 subpacket header 554 sequence 01000100 maps as follows to the R0, C0-C7 values of the uncompressed data 510:

01000100: col. 7 is sparsity (e.g., stores the configured sparsity value)
01000100: col. 6 is not sparsity (e.g., stores non-sparsity value D1)
01000100: col. 5 is sparsity
01000100: col. 4 is sparsity
01000100: col. 3 is sparsity
01000100: col. 2 is not sparsity (e.g., stores non-sparsity value D0)
01000100: col. 1 is sparsity
01000100: col. 0 is sparsity The second R0 sub-packet header (e.g., the sub-packet header 554 information corresponding to R0 of the second sub-packet compression 550-2) can be generated as the sub-packet header sequence 00001000, which maps as follows to the R0, C8-C15 values of the uncompressed data 510:

00001000: col. 15 is sparsity
00001000: col. 14 is sparsity
00001000: col. 13 is sparsity
00001000: col. 12 is sparsity
00001000: col. 11 is not sparsity (e.g., stores non-sparsity value D2)
00001000: col. 10 is sparsity
00001000: col. 9 is sparsity
00001000: col. 8 is sparsity Row R1 of the uncompressed data 510 corresponds to the third subpacket header sequence 00000000 (e.g., the subpacket header 554 information in R1 of the first sub-packet compression 550-1) and the fourth subpacket header sequence 00000010 (e.g., the sub-packet header 554 information in R1 of the second sub-packet compression 550-2). The third subpacket header sequence 00000000 indicates that R1, C1-C7 are each sparsity. The fourth subpacket header sequence 00000010 maps as follows to the R1, C8-C15 values of the uncompressed data 510:

00000010: col. 15 is sparsity
00000010: col. 14 is sparsity
00000010: col. 13 is sparsity
00000010: col. 12 is sparsity
00000010: col. 11 is sparsity
00000010: col. 10 is sparsity
00000010: col. 9 is not sparsity (e.g., stores non-sparsity value D3)
00000010: col. 8 is sparsity In some aspects, the first four sub-packets of 8B each (e.g., the first sub-packet R0, C0-C7; the second sub-packet R0, C8-C15; the third sub-packet R1, C0-C7; the fourth sub-packet R1, C8-C15) can be packed into one compressed packet within the compressed data 590. For example, the first four sub-packets can be packed into a first compressed packet represented by row R0 of the compressed data 590. The first compressed packet can include the respective sub-packet headers for each of the four sub-packets. In some aspects, a compressed packet includes only the respective sub-packet headers for the sub-packets that are not all sparsity (e.g., in this example, the first compressed packet includes the respective sub-packet headers for the first, second, and fourth sub-packets but not the third sub-packet, as the third sub-packet is all sparsity).

As noted previously, each compressed packet of the compressed data 590 (e.g., each row R0-R3 of the compressed data 590) can include a respective two-stage packet header indicative of the UBFMC sparsity-based sub-packet compression applied for each respective compressed packet. The first packet header of the two-stage packet header can be indicative of whether the corresponding compressed packet has been UBFMC coded or compressed, and the sub-packet header coding. The first packet header can also be referred to as a "first stage header" or "first stage packet header," such as a first stage packet header 594 associated with the compressed data 590 of FIG. 5. The second packet header of the two-stage packet header can be indicative of the respective sub-packet sparsity locations for the sub-packets associated with the compressed packet. The second packet header can also be referred to as a "second stage header" or "second stage packet header," such as a second stage packet header 596 associated with the compressed data 590 of FIG. 5.

Each compressed packet of the compressed data 590 can be associated with a global header 592 included in the compressed data 590. The global header can be indicative of one or more configured sparsity values that can be used for the UBFMC compression and decompression. For instance, the global header 592 can be indicative of a first configured sparsity value 592-0 (e.g., "value 0") and a second configured sparsity value 592-1 (e.g., "value 1"). In some aspects, the first configured sparsity value 592-0 of the global header 592 can be the same as one of the first sparsity value 505-0 or the second sparsity value 505-1 included in the uncompressed data 510. In some aspects, the second configured sparsity value 592-1 of the global header 592 can be the same as one of the first sparsity value 505-0 or the second sparsity value 505-1 included in the uncompressed data 510.

In some aspects, a global header 592 associated with 8-bit packing (e.g., as in the example of FIG. 5) can include the first configured sparsity value 592-0 on bits [0:7] and the second configured sparsity value 592-1 on bits [8:15]. For instance, in 8-bit packing, each data value of the uncompressed data 510 is represented on 8 bits (e.g., one byte), and the global header 592 can represent the first and second configured sparsity values 592-0, 592-1 (respectively) on 16 bits (e.g., two bytes). In another example, a global header associated with 16-bit packing (e.g., as in the example of FIG. 6) can include a first configured sparsity value on bits [0:15] and a second configured sparsity value on bits [16:31]. For instance, in 16-bit packing, each data value of the uncompressed data is represented on 16 bits (e.g., two bytes), and the global header can represent the first and second configured sparsity values on 32 bits (e.g., four bytes).

As noted previously, FIG. 5 corresponds to an example of UBFMC sub-packet compression 500 using 8-bit packing. Each data value of the uncompressed data 510 is represented on 8 bits, and the global header can be represented on 16 bits (e.g., 8 bits for each of the two configured sparsity values 592-0, 592-1). The first stage packet header 594 for each compressed packet (e.g., each row of the compressed data 590) can be represented on 8 bits. The second stage packet header 596 for each compressed packet (e.g., each row of the compressed data 590) can be represented on 0-32 bits (e.g., with 0 bits used if all four sub-packet headers for a compressed packet represent all sparsity; 8 bits used if one sub-packet header represents not all sparsity and three sub-packet headers represent all sparsity; 16 bits used if two sub-packet headers represent not all sparsity and two sub-packet headers represent all sparsity; 24 bits used if three sub-packet headers represent not all sparsity and one sub-packet header represents all sparsity; and 32 bits used if all four sub-packet headers for the compressed packet represent not all sparsity).

For instance, the first compressed packet (e.g., row R0) of the compressed data 590 can have a first stage packet header 594 that corresponds to UBFMC compression performed for the first four sub-packets. In some aspects, the first stage packet header 594 for a respective compressed packet (e.g., row of the compressed data 590) can be generated based on and corresponding to the up to four sub-packet headers associated with the respective compressed packet (e.g., the second stage packet headers 596 of the same row of the compressed data 590). In some cases, the first compressed packet (e.g., row R0) of the compressed data 590 can have a first stage packet header 594 sequence given as 10001011. The first stage packet header 594 can be represented on one byte (e.g., 8 bits) as follows:

Xxxxxxxx: [Bit 7] CODED_PKT
 1: packet is UBFMC coded
 0: packet is not UBFMC coded, indicating that the following 32B payload is original/uncompressed data
xXxxxxxx: [Bit 6] QDM_MODE_EN
 1: packet is coded using a Quad-Data Macro (QDM) mode (e.g., see FIG. 7)
 0: packet is coded using a non-QDM mode
xxXxxxxx: [Bit 5] 16-b_MODE-EN
 1: data is coded in 16-b mode (e.g., 16-bit packing is used)
 0: data is coded in 8-b mode (e.g., 8-bit packing is used)
xxxXxxxx: [Bit 4] SPARSITY SEL
 1: configured sparsity value is equal to a first configured sparsity value indicated in the global packet header
 0: configured sparsity value is equal to a second configured sparsity value indicated in the global packet header, or a value other than the first sparsity value (e.g., such as a value of 0)
xxxxXxxx: [Bit 3] Masking value coding for 4th 8B sub-packet
 1: not all sparsity
 0: all sparsity
xxxxxXxx: [Bit 2] Masking value coding for $3^{rd}$ 8B sub-packet
 1: not all sparsity
 0: all sparsity
xxxxxxXx: [Bit 1] Masking value coding for $2^{nd}$ 8B sub-packet
 1: not all sparsity
 0: all sparsity
xxxxxxxX: [Bit 0] Masking value coding for $1^{st}$ 8B sub-packet
 1: not all sparsity
 0: all sparsity For instance, the first stage packet header 594 sequence 10001011 corresponding to compression of the first four sub-packets of the uncompressed data 510 (e.g., the 32B of data from R0, C0-R1, C15) can be indicative of information associated with the UBFMC coding of the corresponding compressed packet (e.g., the row R0 compressed packet of compressed data 590) and/or can be indicative of information associated with the first four sub-packet headers (e.g., R0 and R1 of the first sub-packet compression 550-1 and R0 and R1 of the second sub-packet compression 550-2).

The first four bits (e.g., 1000) of the 8-bit first stage packet header 594 sequence 10001011 can indicate that the first compressed packet (e.g., row R0 of the compressed data 590, and associated with rows R0 and R1 of the uncompressed data 510) is a coded packet, uses a non-QDM mode, is compressed using 8-bit packing, and uses a configured sparsity value equal to the global sparsity value 592-0 from the global header 592 of the compressed data 590). In another example, a bit sequence of '1001' for the first four bits of the 8-bit first stage packet header 594 sequence would indicate the same as above, but with a configured sparsity value equal to the global sparsity value 592-1 (e.g., based on flipping the value of Bit 4 from '0' to '1'). In some aspects, a greater or lesser number of global sparsity values (e.g., more or less than the two global sparsity values 592-0 and 592-1) can be utilized and/or can be indicated in the global header 592.

The last four bits (e.g., 1011) of the 8-bit first stage packet header 594 sequence 10001011 of row R0 of the compressed data 590 can indicate that the 4th sub-packet is not all sparsity, the $3^{rd}$ sub-packet is all sparsity, the $2^{nd}$ sub-packet is not all sparsity, and the $1^{st}$ sub-packet is not all sparsity.

For each sub-packet that is not all sparsity, the corresponding sub-packet header can be included in the second stage packet header 596 of the compressed packet representation that includes the sub-packet. For instance, the first compressed packet (e.g., row R0 of the compressed data 590) includes a second stage packet header 596 that includes the first sub-packet header 01000100, included in R0 of the first sub-packet compression 550-1 and generated for the first sub-packet on R0, C0-C7 of the uncompressed data 510; the second sub-packet header 00001000, included in R0 of the second sub-packet compression 550-2 and generated for the second sub-packet on R0, C8-C15 of the uncompressed data 510; and the fourth sub-packet header 00000010, included in R1 of the second sub-packet compression 550-2 and generated for the fourth sub-packet on R1, C8-C15 of the uncompressed data 510.

The third sub-packet header 00000000 is not included in the second stage packet header 596 of the first compressed packet, as indicated by Bit 2 of the first stage packet header 594 of the first compressed packet being set to a value of '0', indicating that the 8 bits of the third sub-packet are all sparsity.

In the example of FIG. 5, the 32B of original uncompressed data 510 on R0, C0-R1, C15 is compressed into a total of 8B (e.g., 1B first stage packet header 594, 3B second stage packet header 596 including three sub-packet headers of 1B each, and 4B of non-sparsity data values D0, D1, D2, D3).

Rows R6 and R7 of the uncompressed data 510 have no sparsity (e.g., does not include the first sparsity value 505-0 or the second sparsity value 505-1), and each row includes 16 data values. Row R6 of the uncompressed data 510 includes the respective data values D12-D27 (e.g., on R6, C0-C15 of the uncompressed data 510). Row R7 of the uncompressed data 510 includes the respective data values D28-D43 (e.g., on R7, C0-C15 of the uncompressed data 510).

The 32B data packet for rows R6 and R7 of the uncompressed data 510 corresponds to the four sub-packet header 554 sequences '11111111' shown in rows R6 and R7 of the first sub-packet compression 550-1 and the second sub-packet compression 550-2. In some aspects, when all four sub-packets of a 32B uncompressed data packet have no sparsity (e.g., all four sub-packet header 554 sequences are '11111111'), a compressed packet can be generated with a first stage packet header 594 setting Bit 7 to a value of '0', indicating that the compressed packet includes a payload of 32B of uncompressed data (e.g., setting Bit 7 of the first stage packet header 594 to a value of '0' can indicate a completely full packet that does not include sparsity and is not compressed in size from uncompressed data 510 to compressed data 590).

For instance, row R3 of the compressed data 590 corresponds to a compressed packet for rows R6 and R7 of the uncompressed data 510, and includes the respective first stage packet header 594 sequence '0xxxxxxx.' Here, because Bit 7 of the first stage packet header 594 is set to a value of '0' indicating that the compressed packet is un-coded, the first stage packet header 594 Bits 1-6 can be omitted or disregarded (e.g., indicated in the first stage packet header sequence with 'x'). Additionally, the compressed packet (e.g., row R3 of the compressed data 590) can omit the four sub-packet header sequences '11111111', as there is not a need to include sub-packet header sequences indicative of sub-packet sparsity locations when no sparsity is present in the 32B of original data (e.g., rows R6 and R7 of the uncompressed data 510).

In some aspects, the compressed packet on row R3 of the compressed data 590 can be referred to as a "full packet," or a packet that has an un-compressed payload due to the lack of sparsity in the underlying 32B data payload. Including only the first stage packet header 594 for the compressed representation of a completely full packet corresponds to a worst-case overhead addition of 1B/32B=3.125% (e.g., one byte overhead from the first stage packet header 594, 32B of original data values in the payload of the compressed packet representation).

Figure 6:
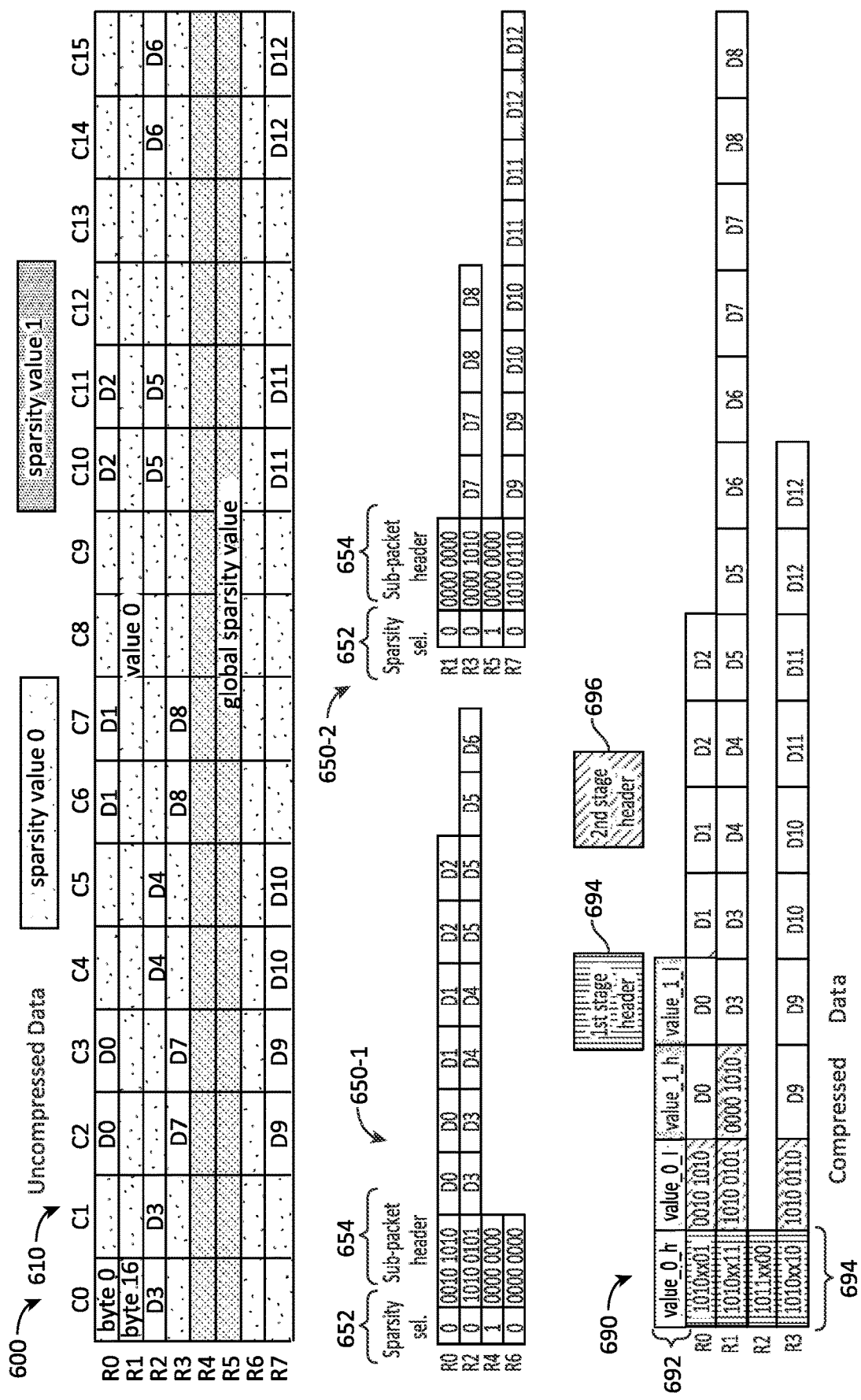
FIG. 6 illustrates an example of sub-packet compression using a two-stage packet header and 16-bit data packing, in accordance with some examples.

FIG. 6 illustrates an example of sub-packet compression 600 using a two-stage packet header and 16-bit data packing, in accordance with some examples. For instance, the 16-bit sub-packet compression 600 of FIG. 6 can be similar to the 8-bit sub-packet compression 500 of FIG. 5. Here, each data value of the uncompressed data 610 utilizes 16 bits (e.g., two bytes), and occupies two of the individual boxes within the 8×16 grid used to represent the uncompressed data 610 (e.g., where each individual box represents 8 bits/1 byte).

For example, the data value 'D0' occupies R0, C2-C3 of the uncompressed data 610. The data value 'D1' occupies R0, C6-C7; the data value 'D2' occupies R0, C10-C11; the data value 'D3' occupies R2, C0-C1; the data value 'D4' occupies R2, C4-C5; etc.

In examples of 16-bit data packing, each 32-byte packet of the uncompressed data 610 can include two 16-byte sub-packets. For instance, a first 32-byte packet of the uncompressed data 610 includes a first 16-byte sub-packet corresponding to R0, C0-C15 and a second 16-byte sub-packet corresponding to R1, C0-C15. In some examples, each 16B sub-packet of the uncompressed data 610 can correspond to a different row (e.g., row R1, R2, . . . , R7) of the uncompressed data 610.

Sub-packet compression can be performed for the 16-byte sub-packets of the uncompressed data 610 to remove data values equal to one or more configured sparsity values. For instance, a first sub-packet compression 650-1 can be generated based on compressing the sub-packets corresponding to rows R0, R2, R4, and R6 of the uncompressed data 610. A second sub-packet compression 650-2 can be generated based on compressing the sub-packets corresponding to rows R1, R3, R5, and R7 of the uncompressed data 610.

Each compressed sub-packet (e.g., each row of the first or second sub-packet compression 650-1, 650-2) can include a sparsity selection 652 that can be the same as or similar to the sparsity selection 552 of FIG. 5. Each compressed sub-packet can include a sub-packet header 654 that can be the same as or similar to the sub-packet header 554 of FIG. 5. For instance, while the sub-packet compression 500 of FIG. 5 is based on 8-bit packing and the sub-packet compression 600 of FIG. 6 is based on 16-bit packing, in both cases, the respective sub-packets of uncompressed data include eight values. For instance, in the 8-bit packing of FIG. 5, a 32B packet includes four 8B sub-packets, where each 8B sub-packet includes eight 1B data values. In the 16-bit packing of FIG. 6, a 32B packet includes two 16B sub-packets, where each 16B sub-packet includes eight 2B data values.

The sub-packet header 654 can be indicative of sparsity location information within the sub-packet, where each bit-position of the eight-bit sub-packet header 654 corresponds to two bytes within the sub-packet's corresponding uncompressed data 610. For instance, row R0 of the first sub-packet compression 650-1 includes a first sub-packet header 654 for the first sub-packet on R0, C0-C15 of the uncompressed data 610. The first sub-packet header 654 has a sequence of 00101010. The left-most bit (e.g., Bit 7) has a value of '0', and indicates that R0, C14-C15 is sparsity. The second from left bit (e.g., Bit 6) has a value of '0', and indicates that R0, C12-C13 is sparsity. The third from left bit (e.g., Bit 5) has a value of '1' and indicates that R0, C10-C11 is not sparsity (e.g., corresponding to data value D2). Bit 3 has a value of '1' and indicates that R0, C6-C7 is not sparsity (e.g., corresponding to data value D1). Bit 1 has a value of '1' and indicates that R0, C2-C3 is not sparsity (e.g., corresponding to data value D0). The first sub-packet header 654 has a payload of [D0 D0 D1 D1 D2 D2], with all occurrences of a configured sparsity value removed and with the remaining three 2-byte data values tightly packed onto a total payload of 6-bytes.

In another example, row R0 of the second sub-packet compression 650-2 includes a second sub-packet header 654 for the second sub-packet on R1, C0-C15 of the uncompressed data 610. The second sub-packet header 654 has a sequence of 00000000, indicating that the second sub-packet of the uncompressed data 610 is all sparsity. The second sub-packet header 654 has no payload (or an empty payload [ ]), based on the second sub-packet including no non-sparsity data values to be packed into the sub-packet payload.

The third sub-packet corresponds to row R2 of the uncompressed data 610, and further corresponds to the compressed sub-packet of row R2 of first sub-packet compression 650-1. The third sub-packet header 654 has a sequence of 10100101. The sub-packet header 654 Bits 0, 2, 5, and 7 each have a value of '1', indicating that R2 of uncompressed data 610 includes non-sparsity data values at C14-C15 (e.g., D6), C10-C11 (e.g., D5), C4-C5 (e.g., D4), and C0-C1 (e.g., D3).

A compressed data 690 can be generated based on the first 16-bit packing sub-packet compression 650-1 and the second 16-bit packing sub-packet compression 650-2. The 16-bit packing compressed data 690 of FIG. 6 can be generated the same as or similar to the 8-bit packing compressed data 590 of FIG. 5. For instance, the first stage packet header 694 of FIG. 6 can be the same as or similar to the first stage packet header 594 of FIG. 5. The second stage packet header 696 of FIG. 6 can be the same as or similar to the second stage packet header 596 of FIG. 6.

In some aspects, the first stage packet header 694 can be the same as the first stage packet header 594 of FIG. 5, with Bits 2 and 3 remaining unused (e.g., indicated by an 'x' in FIG. 6, where 'x' can represent no bit value or an arbitrary bit value that is not used for compression). Bits 2 and 3 of the first stage packet header 694 can remain unused based on each 32B packet not including a third or fourth sub-packet, to which Bits 2 and 3 would otherwise correspond. Bits 0 and 1 of the first stage packet header 694 can be used to indicate whether the first sub-packet and the second sub-packet, respectively, are not all sparsity (e.g., bit value of '1') or are all sparsity (e.g., bit value of '0'). The first four bits of each first stage packet header 694 bit sequence (e.g., Bits 7-4) can be the same as the Bits 7-4 described above with respect to FIG. 5.

Each row of the compressed data 690 can represent a compressed 32B packet from the uncompressed data 610. For instance, row R0 of the compressed data 690 includes the sub-packet compression for the first sub-packet of the uncompressed data 610 (e.g., R0, C0-C15 of the uncompressed data 610), which can be the same as the row R0 entry of the first sub-packet compression 650-1.

Row R1 of the compressed data 690 includes the sub-packet compression for the third sub-packet of the uncompressed data 610 (e.g., R2, C0-C15 of the uncompressed data 610), which can be the same as the row R2 entry of the first sub-packet compression 650-1. Row R1 of the compressed data 690 can further include the sub-packet compression for the fourth sub-packet of the uncompressed data 610 (e.g., R3, C0-C15 of the uncompressed data 610), which can be the same as the row R3 entry of the second sub-packet compression 650-2.

The 16-bit data packing compressed data 690 can include a corresponding 16-bit global header 692 indicative of the sparsity value 0 and sparsity value 1 (e.g., indicative of the first and second configured sparsity information for uncompressed data 610, respectively). For instance, global header 692 can include a "value_0_h" byte indicating the sparsity value 0 high and a "value_0_l" byte indicating the sparsity value 0 low. Global header 692 can further include a "value_1_h" byte indicating the sparsity value 1 high and a "value_1_l" byte indicating the sparsity value 1 low.

Figure 7:
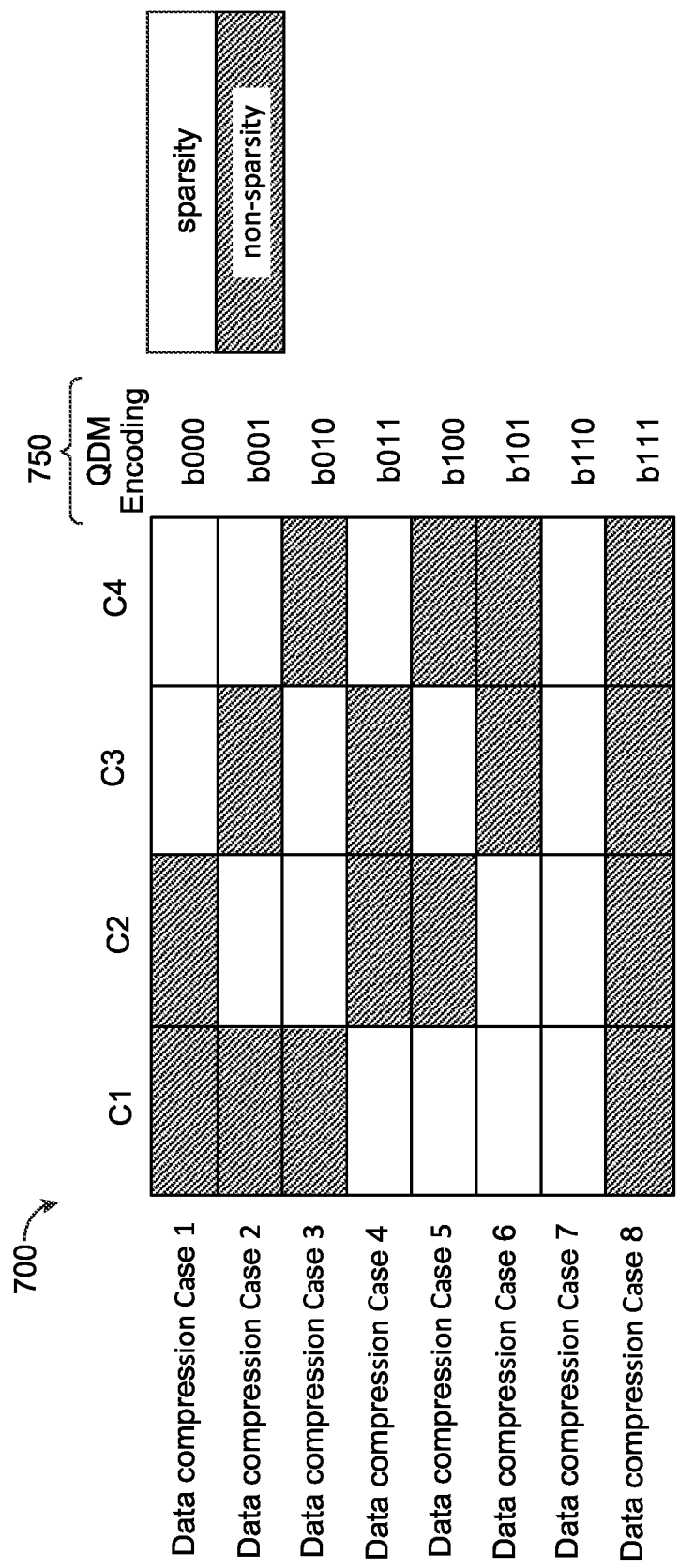
FIG. 7 illustrates an example of a Quad-Data-Macro (QDM) compression table for structured sparsity, in accordance with some examples.

FIG. 7 illustrates an example of a Quad-Data-Macro (QDM) compression table 700 for structured sparsity, in accordance with some examples. In some aspects, QDM compression table 700 can be used to implement a QDM mode for performing compression based on the presence of structured sparsity (e.g., configured sparsity patterns). For instance, structured sparsity can be used to improve an overall compression ratio achieved by the UBFMC compression. In some examples, a structured sparsity implementation may be based on a 2:4 format. In 2:4 structured sparsity, 2 sparsity data values are included in each set of four original (e.g., uncompressed data).

For instance, QDM compression table 700 illustrates the eight data compression cases 1-8 that may be associated with 2:4 structured sparsity, and a corresponding QDM encoding 750 for each data compression case. For example, the QDM mode sub-packet size can be 4 bytes (e.g., four uncompressed data values). The QDM encoding 750 can be implemented as a 3-bit metadata sequence that is used to encode the sparsity pattern of a respective 4 bytes of uncompressed data. For instance, the 3-bit QDM encoding 750 can be a metadata sequence indicative of a QDM sparsity pattern. In the 2:4 structured sparsity example, there are eight data compression cases each corresponding to a different 2:4 structured sparsity pattern or sequence. In six of the eight data compression cases, there are two sparse values and two non-sparse value (e.g., data compression cases 1-6). In one of the eight data compression cases, all four values are sparse (e.g., data compression case 7). In one of the eight data compression cases, all four values are non-sparse (e.g., data compression case 8).

In some aspects, each of the four data values in a 2:4 structured sparsity sequence can be packed individually. For a 32B data packet of uncompressed data, in 8-bit data packing mode, every four data values uses four bytes, and 3*8=24 bits of QDM metadata may be used to indicate the respective 2:4 structured sparsity sequence of each of the eight 4B data sequences. The QDM metadata size can be further reduced with 16-bit data packing, in which every four data values uses eight bytes (e.g., 3*4=12 bits of QDM metadata may be used to indicate the respective 2:4 structured sparsity sequence of each of the four 8B data sequences).

In some examples, each 32B packet of uncompressed data can be compressed with QDM mode (e.g., using QDM compression table 700 and/or the QDM encodings 750) or can be compressed using a random sparsity mode (e.g., the same as or similar to the random sparsity compression mode described above with respect to FIGS. 5 and 6) for best compression ratio. In some aspects, 4×16-bit data are compressed as one sub-packet in QDM mode (e.g., 4×4 bytes=16B sub-packets, as described above).

In data compression case 1, the structured sparsity format is [non-sparsity non-sparsity sparsity sparsity] (e.g., abbreviated herein as [N N S S]). The data compression case 1 QDM encoding 750 is the bit sequence '000.'

In data compression case 2, the structured sparsity format is [N S N S] and the corresponding QDM encoding 750 is the bit sequence '001.'

In data compression case 3, the structured sparsity format is [N S S N] and the corresponding QDM encoding 750 is the bit sequence '010.'

In data compression case 4, the structured sparsity format is [S N N S] and the corresponding QDM encoding 750 is the bit sequence '011.'

In data compression case 5, the structured sparsity format is [S N S N] and the corresponding QDM encoding 750 is the bit sequence '100.'

In data compression case 6, the structured sparsity format is [S S N N] and the corresponding QDM encoding 750 is the bit sequence '101.'

In data compression case 7, the structured sparsity format is [S S S S] and the corresponding QDM encoding 750 is the bit sequence '110.'

In data compression case 8, the structured sparsity format is [N N N N] and the corresponding QDM encoding 750 is the bit sequence '111.'

In some cases, the 0:4 (e.g., all non-sparsity values with 0 sparsity per 4 data values, such as data compression case 8) and/or the 4:4 (e.g., all sparsity values with 4 sparsity per 4 data values, such as data compression case 7) may be optional. In some cases, the 0:4 and 4:4 cases can be excluded. In some examples, the 1:4 sparsity pattern (e.g., 1 sparsity per 4 data values) can be compressed as 2:4 (e.g., using one of the six data compression cases 1-6 of FIG. 7). In some aspects, various other QDM encoding patterns (e.g., using a greater or lesser number of bits than the example QDM encoding 750 of FIG. 7, using different patterns or structured sparsity formats than the example QDM encoding 750 of FIG. 7, etc.) may be utilized. In some examples, the 3-bit QDM encodings 750 for each of the 2:4 structured sparsity data compression cases may be different from those described above and/or shown in FIG. 7.

Figure 8:
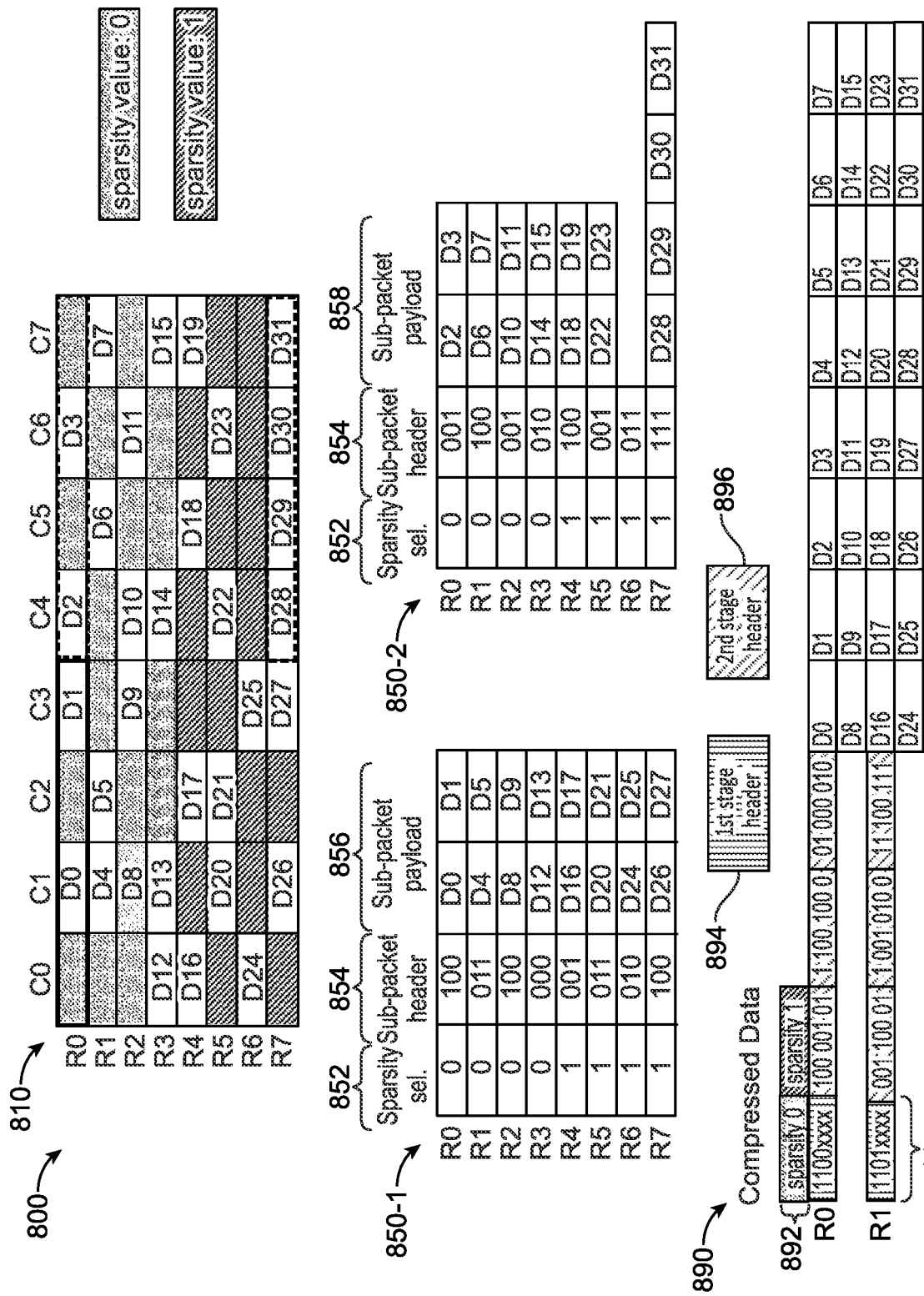
FIG. 8 illustrates an example of sub-packet compression using a two-stage packet header, 8-bit data packing, and QDM mode, in accordance with some examples.

FIG. 8 illustrates an example of sub-packet compression 800 using a two-stage packet header, 8-bit data packing, and QDM mode, in accordance with some examples. For instance, sub-packet compression 800 can be performed using a QDM mode based on the QDM compression table 700 and/or QDM encodings 750 of FIG. 7.

An uncompressed data 810 can include 64B of uncompressed data values, where each uncompressed data value occupies 1B (e.g., one individual box in the 8×8 grid of rows R0-R7 and columns C1-C7 associated with uncompressed data 810). The uncompressed data 810 can be associated with a first configured sparsity value (e.g., "sparsity value 0") and a second configured sparsity value (e.g., "sparsity value 1"). The uncompressed data 810 can include the 32 data values D0, D1, . . . , D31. The remaining 64−32=32 data values of uncompressed data 810 can have either the configured sparsity value 0 or the configured sparsity value 1.

In the 8-bit data packing case, sub-packet compression can be performed for uncompressed data 810 based on a sub-packet size of four bytes (4B) (e.g., four 8-bit data values per sub-packet). For instance, the QDM mode sub-packet size is four data values, and in 8-bit packing, each data value is 8-bit or 1-byte. In this example, each row R0, R1, . . . , R7 of the uncompressed data 810 corresponds to two sub-packets, with a first sub-packet on Rn, C0-C3 and a second sub-packet on Rn, C4-C7 for n=0, 1, . . . , 7.

A first QDM sub-packet compression 850-1 can correspond to compressing the respective first sub-packet of each row Rn of the uncompressed data 810. A second QDM sub-packet compression 850-2 can correspond to compressing the respective second sub-packet of each row Rn of the uncompressed data 810. For instance, the first QDM sub-packet compression 850-1 can include a respective sub-packet compression for the first sub-packet of each row of the uncompressed data 810 and the second QDM sub-packet compression 850-2 can include a respective sub-packet compression for the second sub-packet of each row of the uncompressed data 810.

The first and second sub-packet compressions 850-1, 850-2 (respectively) can each include a sparsity selection 852 (e.g., a sparsity selection indicator), indicating whether each respective compressed sub-packet is compressed using the configured sparsity value 0 or the configured sparsity value 1. The sparsity selection 852 of FIG. 8 can be the same as or similar to the sparsity selection 652 of FIG. 6 and/or the sparsity selection 552 of FIG. 5.

Each compressed sub-packet can further include a sub-packet header 854, indicative of the corresponding QDM encoding 750 of FIG. 7 for the 4B of uncompressed data 810 included in the respective sub-packet. The sub-packet payload 856, 858 of the first and second sub-packet compressions 850-1, 850-2, respectively, can tightly pack (e.g., on adjacent bytes) the two non-sparsity data values included in the respective sub-packet, with the two sparsity data values (indicated by the corresponding sparsity selection 852) removed. Each sub-packet payload 856, 858 can include two non-sparsity data values, based on a structured sparsity 2:4 format, such as the 2:4 structured sparsity of FIG. 7.

For instance, the row R0 of the uncompressed data 810 can be sub-packet compressed into a first compressed sub-packet represented on row R0 of the first sub-packet compression 850-1 and a second compressed sub-packet represented on row R0 of the second sub-packet compression

850-2. For instance, the first sub-packet on row R0 of the uncompressed data 810 (e.g., R0, C0-C3) comprises the sequence [0 D0 0 D1], which corresponds to the data compression case 5 and QDM encoding 750 bit-sequence '100' of FIG. 7. The corresponding sub-packet header 854 can be set equal to the QDM bit-sequence encoding '100,' indicative of a [sparsity non-sparsity sparsity non-sparsity] pattern of data values. The first sub-packet payload 856 includes the two data values D0 and D1 packed on adjacent bytes, with sparsity values removed.

The second sub-packet on row R0 of the uncompressed data 810 can be sub-packet compressed into a second compressed sub-packet represented on row R0 of the second sub-packet compression 850-2. The second sub-packet is on row R0 of the uncompressed data 810 (e.g., R0, C4-C7) and comprises the sequence [D2 0 D3 0], which corresponds to the data compression case 2 and QDM encoding 750 bit-sequence '001' of FIG. 7. The corresponding sub-packet header 854 can be set equal to the QDM bit-sequence encoding '001,' indicative of a non-sparsity sparsity non-sparsity sparsity] pattern of data values. The second sub-packet payload 858 includes the two data values D2 and D3 packed on adjacent bytes, with sparsity values removed.

The QDM mode of the UBFMC compression can support empty sub-packets and full sub-packets. For instance, the second sub-packet of R6 of the uncompressed data 810 (e.g., R6, C4-C7) is an empty sub-packet that includes all sparsity values (e.g., sparsity value 1), and is compressed into the compressed sub-packet representation of row R6 of the second sub-packet compression 850-2 with the sub-packet header QDM encoding bit-sequence "110' corresponding to the FIG. 7 data compression case 7 of all sparsity values. The corresponding payload 858 is omitted or is an empty payload [ ], as no non-sparsity data values are included in the empty sub-packet.

The second sub-packet of R7 of the uncompressed data 810 (e.g., R7, C4-C7) is a full sub-packet that includes all non-sparsity values, and is compressed into the compressed sub-packet representation of row R7 of the second sub-packet compression 850-2 with the sub-packet header QDM encoding bit-sequence '111' corresponding to the FIG. 7 data compression case 8 of all non-sparsity values. The corresponding payload 858 includes the four data values [D28 D29 D30 D31], as there are no sparsity data values included in the full sub-packet that can be omitted from the compressed sub-packet.

The QDM-mode compressed data 890 can include a global header 892 that is the same as or similar to the global header 592 of FIG. 5 and/or the global header 692 of FIG. 6. A first stage packet header 894 can be the same as or similar to the first stage packet header 594 of FIG. 5 and/or the first stage packet header 694 of FIG. 6. For instance, the first stage packet header 894 of FIG. 8 can include the same Bit 7-Bit 4 values as the first stage packet header 594 of FIG. 5 and/or the first stage packet header 694 of FIG. 6. The last four values of the first stage packet header 894 can be omitted (e.g., Bit 3-Bit 0 of the first stage packet header 594 of FIG. 5 can be omitted), and are represented in FIG. 8 with an 'x', which can represent a non-included bit or bit-value and/or can represent an arbitrary bit-value that is not utilized.

Eight sub-packets can be coded to one QDM-mode compressed packet of the compressed data 890. For instance, each QDM-mode compressed packet can be represented as a respective row, R0 or R1, of the compressed data 890. For instance, the first QDM-mode compressed packet corresponding to row R0 of the compressed data 890 can correspond to the eight sub-packets on rows R0-R3 of the uncompressed data 810 (e.g., the eight compressed sub-packets on rows R0-R3 of the first sub-packet compression 850-1 and the second sub-packet compression 850-2).

The second stage packet header 896 of the first QDM-mode compressed packet can be represented on three 8-bit (1-byte) headers '100 001 01', '1 100 100 0,' and '01 000 010'. The 3*8=24-bits of second stage packet header 896 information corresponds to the 8*3=24-bits of QDM encoding sequences for the eight sub-packets (e.g., QDM encoding sequences 750 of FIG. 7). For instance, the second stage packet header 896 sequence '100 001 01' corresponds to the first sub-packet QDM encoding 750 '100,' the second sub-packet QDM encoding 750 '001' and the first two bits of the third sub-packet QDM encoding 750 '011.'

The remaining (e.g., third and final) bit of the third sub-packet QDM encoding 750 '011' is included in the subsequent second stage packet header 896 sequence '1 100 100 0', which also includes the fourth sub-packet QDM encoding 750 '100', the fifth sub-packet QDM encoding 750 '100', and the first bit of the sixth sub-packet QDM encoding 750 '001.'

The remaining two bits of the sixth sub-packet QDM encoding 750 '001' are included in the final second stage packet header 896 sequence '01 000 010,' which also includes the seventh sub-packet QDM encoding 750 '000' and the eighth sub-packet QDM encoding 750 '010.'

The payload of the first QDM-mode compressed packet (e.g., row R0 of the compressed data 890) includes the tightly packed non-sparsity data values corresponding to each of the eight sub-packets. For instance, the payload includes the data values D0 and D1 corresponding to the first sub-packet, the data values D2 and D3 corresponding to the second sub-packet, . . . , and the data values D14 and D15 corresponding to the eighth sub-packet of the uncompressed data 810.

The second QDM-mode compressed packet (e.g., row R1 of the compressed data 890) can be generated the same as or similar to the first QDM-mode compressed packet described above. The second QDM-mode compressed packet corresponds to the eight sub-packets on rows R4, C0-R7, C7 of the uncompressed data 810.

Figure 9:
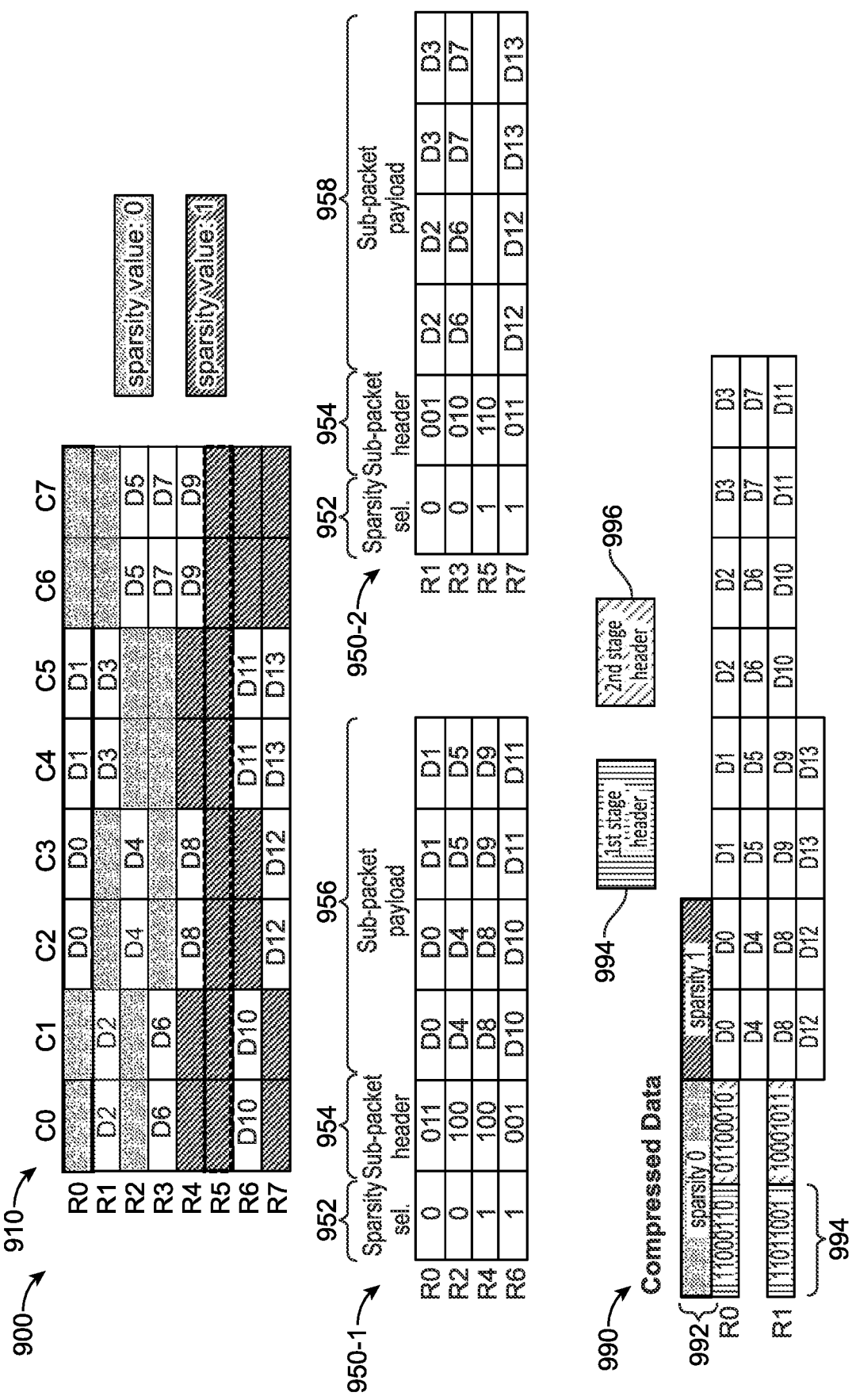
FIG. 9 illustrates an example of sub-packet compression using a two-stage packet header, 16-bit data packing, and QDM mode, in accordance with some examples.

FIG. 9 illustrates an example of sub-packet compression 900 using a two-stage packet header, 16-bit data packing, and QDM mode, in accordance with some examples. For instance, the 16-bit data packing QDM-mode sub-packet compression 900 of FIG. 9 can be similar to the 8-bit data packing QDM-mode sub-packet compression 800 of FIG. 8. In the example of FIG. 9, the uncompressed data 910 can include a plurality of data values D0, D1, . . . , D13 each represented on 16-bits (e.g., 2-bytes) and a plurality of sparsity values each represented on 16-bits (e.g., 2-bytes). The sparsity values can be a first configured sparsity value (e.g., "sparsity value 0") or a second configured sparsity value (e.g., "sparsity value 1").

Each sub-packet in the 16-bit data packing QDM-mode compression can include four values on 4*2=8 bytes. For instance, the uncompressed data 910 can include eight sub-packets, each sub-packet corresponding to a respective row R0, R1, . . . , R7 of the uncompressed data 910. Each sub-packet (e.g., row of the uncompressed data 910) can utilize a structured sparsity pattern included in the QDM compression table 700 of FIG. 7.

A first sub-packet compression 950-1 can be generated for the rows R0, R2, R4, and R6 of the uncompressed data 910. A second sub-packet compression 950-2 can be generated for the rows R1, R3, R5, and R7 of the uncompressed data

910. Each compressed sub-packet can include a sparsity selection 952 that is the same as or similar to the sparsity selection 552 of FIG. 5, the sparsity selection 652 of FIG. 6, and/or the sparsity selection 852 of FIG. 8. Each compressed sub-packet can additionally include a corresponding sub-packet header 954, which can be the same as or similar to the QDM encoding 750 bit-sequences of FIG. 7 and/or the sub-packet headers 954 of FIG. 9. Each compressed sub-packet can include a respective compressed sub-packet payload 956, 958, which may be the same as or similar to the compressed sub-packet payloads 856, 858 of the first and second sub-packet compressions 850-1, 850-2 (respectively) of FIG. 8. The compressed sub-packet payloads 956, 958 can include the non-sparsity data values included in each four data value sub-packet, with the two sparsity values removed and the remaining non-sparsity data values packed on adjacent bytes. The 16-bit data packing QDM-mode of FIG. 9 can support empty 16-bit QDM sub-packets, such as the empty 16-bit QDM sub-packet corresponding to row R5 of the uncompressed data 910, and may additionally support full 16-bit QDM sub-packets.

A 16-bit data packing compressed data 990 can be generated based on the sub-packet compression performed for the sub-packets of the uncompressed data 910 (e.g., based on the first sub-packet compression 950-1 and the second sub-packet compression 950-2). The compressed data 990 can include one or more 16-bit data packing compressed packets, for instance with one compressed data packet per row of the compressed data 990. In some aspects, the compressed data 990 can include a first compressed data packet in row R0, corresponding to the uncompressed data 910 rows R0, C0-R3, C7 and a second compressed data packet in row R1, corresponding to the uncompressed data 910 rows R4, C0-R7, C7. The first compressed data packet of row R0 of the compressed data 990 can correspond to the compressed sub-packets of rows R0 and R2 of the first sub-packet compression 950-1 and rows R1 and R3 of the second sub-packet compression 950-2. The second compressed data packet of row R1 of the compressed data 990 can correspond to the compressed sub-packets of rows R4 and R6 of the first sub-packet compression 950-1 and rows R5 and R7 of the second sub-packet compression 950-2.

The global header 992 of FIG. 9 can be the same as or similar to the global header 892 of FIG. 8. The global header 992 of FIG. 9 can additionally be the same as or similar to one or more of the global header 592 of FIG. 5, the global header 692 of FIG. 6, etc. The first stage packet header 994 of FIG. 9 can be the same as or similar to the first stage packet header 894 of FIG. 8. The second stage packet header 996 of FIG. 9 can be the same as or similar to the second stage packet header 896 of FIG. 8.

In some aspects, the two-stage packet header information for each compressed packet (e.g., each row) of the compressed data 990 can be provided on one first stage packet header 994 and one second stage packet header 996 (e.g., can be provided on a total of 2-bytes or 16-bits). For instance, the four left-most bits of the first stage packet header 994 (e.g., Bit 7-Bit 4) can be the same as the Bits 7-4 of the first stage packet header 894 of FIG. 8, Bits 7-4 of the first stage packet header 694 of FIG. 6, and/or the same as the first stage packet header 594 of FIG. 5.

The four right-most bits of the first stage packet header 994 (e.g., Bit 3-Bit 0) can be used to indicate the first four bits of sub-packet header information. For instance, each compressed packet (e.g., row) of the compressed data 990 corresponds to four 16-bit data packing sub-packets. In QDM-mode, each sub-packet is associated with a sub-packet header on 3-bits, where the sub-packet header is indicative of a QDM encoding bit-sequence 750 of FIG. 7. 12 bits are needed to represent the respective 3-bit QDM encoding bit-sequence for the four sub-packets associated with a respective compressed packet (e.g., row) of the compressed data 990. The 12 bits can be configured as the Bits 3-0 of the first stage packet header 994 and the full 8-bits (e.g., Bits 7-0) of the second stage packet header 996.

For instance, the first compressed packet (e.g., row R0) of the compressed data 990 can include the 12 QDM encoding bit-sequence bits for the first four sub-packets of uncompressed data 910 using the sequence '011 0' (e.g., provided on Bits 3-0 of the first stage packet header 994) and the sequence '01 100 010' provided on Bits 7-0 of the second stage packet header 996. Bit sequence 011 included in the first stage packet header 994 Bits 3-1 corresponds to the QDM encoding bit-sequence '011' for the first sub-packet on row R0, C0-C7 of the uncompressed data 910. Bit sequence 0 (e.g., included on Bit 0 of the first stage packet header 994) and bit sequence 01 (e.g., included on Bits 7 and 6 of the second stage packet header 996) corresponds to the QDM encoding bit-sequence '001' for the second sub-packet on row R1, C0-C7 of the uncompressed data 910.

Bit sequence 100 (e.g., included on Bits 5-3 of the second stage packet header 996) corresponds to the QDM encoding bit-sequence '100' for the third sub-packet on row R2, C0-C7 of the uncompressed data 910. Bit sequence 010 (e.g., included on Bits 2-0 of the second stage packet header 996) corresponds to the QDM encoding bit-sequence of '010' for the fourth sub-packet on row R3, C0-C7 of the uncompressed data 910. In some aspects, the 16-bit data packing QDM-mode sub-packet data compression 900 of FIG. 9 can save a total of 2-bytes (2B) for every 32B of original data (e.g., uncompressed data 910) relative to the 8-bit data packing QDM-mode sub-packet data compression 800 of FIG. 8.

FIG. 10 is a flowchart illustrating an example of a process 1000 for performing data compression. Although the example process 1000 depicts a particular sequence of operations, the sequence may be altered without departing from the scope of the present disclosure. For example, some of the operations depicted may be performed in parallel or in a different sequence that does not materially affect the function of the process 1000. In other examples, different components of an example device or system that implements the process 1000 may perform functions at substantially the same time or in a specific sequence.

At block 1002, the process 1000 includes generating a first compressed sub-packet based on removing one or more sparsity bytes from a first sequence of values corresponding to a first sub-packet, wherein the first sequence of values includes one or more sparsity bytes each equal to a configured sparsity value and one or more non-sparsity bytes each corresponding to a respective data value different from the configured sparsity value.

For example, the first compressed sub-packet can be generated based on performing sub-packet compression that is the same as or similar to the sub-packet compression 500 of FIG. 5 and/or the sub-packet compression 600 of FIG. 6. In some cases, the first sequence of values can be the same as or similar to the uncompressed data 510 of FIG. 5 and/or the uncompressed data 610 of FIG. 6.

The one or more sparsity bytes each equal to a configured sparsity value can be the same as or similar to the first subset of the uncompressed data 510 having a value equal to the first configured sparsity value 505-0 of FIG. 5 and/or the second subset of the uncompressed data 510 having a value equal to the second configured sparsity value 505-1 of FIG. 5. The one or more non-sparsity bytes can be the same as or similar to the third subset of non-sparsity data of the uncompressed data 510 of FIG. 5.

In some examples, the first sub-packet can be the same as or similar to one or more of the sub-packets of FIG. 5. For instance, the first sequence of values corresponding to the first sub-packet compressed sub-packet can be the same as or similar to one or more of the row 0 of uncompressed data 510 of FIG. 5 (e.g., corresponding to a sub-packet from 0:0 to 0:7, and a sub-packet from 0:8 to 0:15), the row 1 of uncompressed data 510 of FIG. 5 (e.g., corresponding to a sub-packet from 1:0 to 1:7, and a sub-packet from 1:8 to 1:15), etc. The four sub-packets of FIG. 5 are ([0:0]-[0:7]; [0:8]-[0:15]; [1:0]-[1:7]; [1:8]-[1:15]).

In some cases, the first compressed sub-packet can be the same as or similar to at least a portion of the first sub-packet compression 550-1 of FIG. 5, generated based on removing one or more sparsity bytes from the first sequence of values corresponding to the respective first sub-packet from [n:0]-[n:7] of each of the 8 rows of the uncompressed data 510 (e.g., for rows n=0, 1, . . . , 7) of FIG. 5. In some cases, the first compressed sub-packet can be the same as or similar to at least a portion of the second sub-packet compression 550-2 of FIG. 5, generated based on removing one or more sparsity bytes from the sequence of values corresponding to the respective second sub-packet from [n:8]-[n:15] of each of the n=0, 1, . . . , 7 rows of the uncompressed data 510 of FIG. 5.

In some cases, the first compressed sub-packet can be generated based on performing sub-packet compression that is the same as or similar to the sub-packet compression 800 of FIG. 8 and/or the sub-packet compression 900 of FIG. 9. In some cases, the first sequence of values can be the same as or similar to the uncompressed data 810 of FIG. 8 and/or the uncompressed data 910 of FIG. 9.

The one or more sparsity bytes can be equal to a configured sparsity value that is the same as or similar to the first configured sparsity value (e.g., "sparsity value 0") of FIG. 8, the second configured sparsity value (e.g., "sparsity value 1") of FIG. 8, the first configured sparsity value (e.g., "sparsity value 0") of FIG. 9, and/or the second configured sparsity value (e.g., "sparsity value 1") of FIG. 9.

The first compressed sub-packet can be the same as or similar to at least a portion (e.g., one or more rows) of the first QDM sub-packet compression 850-1 of FIG. 8 and/or the second QDM sub-packet compression 850-2 of FIG. 8. In some cases, the first compressed sub-packet can be the same as or similar to at least a portion (e.g., one or more rows) of the first QDM sub-packet compression 950-1 of FIG. 9 and/or the second QDM sub-packet compression 950-2 of FIG. 9.

At block 1004, the process 1000 includes generating a first sub-packet header corresponding to the first compressed sub-packet, wherein the first sub-packet header is indicative of a respective location within the first sequence of values of each non-sparsity byte of the one or more non-sparsity bytes.

For instance, the first sub-packet header can be the same as or similar to one or more of the sub-packet header 554 of FIG. 5 and/or the second stage header 596 of FIG. 5; the sub-packet header 654 of FIG. 6 and/or the second stage header 696 of FIG. 6; the sub-packet header 854 of FIG. 8 and/or the second stage header 896 of FIG. 8; and/or the sub-packet header 954 of FIG. 9 and/or the second stage header 996 of FIG. 9; etc.

At block 1006, the process 1000 includes generating a first packet header corresponding to a plurality of compressed sub-packets including the first compressed sub-packet, wherein the first packet header is indicative of the configured sparsity value and respective coding information corresponding to each compressed sub-packet of the plurality of compressed sub-packets.

For instance, the first packet header can be the same as or similar to one or more of the first stage header 594 of FIG. 5, the first stage header 694 of FIG. 6, the first stage header 894 of FIG. 8, and/or the first stage header 994 of FIG. 9. The plurality of compressed sub-packets can correspond to one or more (or all) of the first sub-packet compression 550-1 and the second sub-packet compression 550-2 of FIG. 5; the first sub-packet compression 650-1 and the second sub-packet compression 650-2 of FIG. 6; the first sub-packet compression 850-1 and the second sub-packet compression 850-2 of FIG. 8; and/or the first sub-packet compression 950-1 and the second sub-packet compression 950-2 of FIG. 9.

The first packet header can be indicative of a configured sparsity value that is the same as or similar to one or more of the first configured sparsity value 592-0 or the second configured sparsity value 592-1 of FIG. 5; the first and second configured sparsity values 692 of FIG. 6; the first and second configured sparsity values 892 of FIG. 8; and/or the first and second configured sparsity values 992 of FIG. 9.

In some cases, the respective coding information included in the first packet header is indicative of a data packing mode associated with each compressed sub-packet of the plurality of compressed sub-packets corresponding to the compressed data packet. For instance, the respective coding information can be indicative of an 8-bit data packing mode corresponding to an 8-byte sub-packet size and corresponding to four 8-byte sub-packets per compressed data packet, each 8-byte sub-packet including eight values. In some examples, the 8-bit data packing mode can be the same as or similar to the 8-bit data packing mode of the sub-packet compression 500 of FIG. 5. In some cases, the 8-bit data packing mode can be the same as or similar to the 8-bit data packing mode of the sub-packet compression 800 of FIG. 8. In some cases, the respective coding information can be indicative of a 16-bit data packing mode corresponding to a 16-byte sub-packet size and corresponding to two 16-byte sub-packets per compressed data packet, each 16-byte sub-packet including eight values. For instance, the 16-bit data packing mode can be the same as or similar to the 16-bit data packing mode of the sub-packet compression 600 of FIG. 6. In some examples, the 16-bit data packing mode can be the same as or similar to the 16-bit data packing mode of the sub-packet compression 900 of FIG. 9.

In some cases, the respective coding information included in the first packet header is indicative of a selection between a 4-bit, 8-bit, or 16-bit data packing mode associated with the plurality of compressed sub-packets. For instance, the selection between data packing modes can be indicated based on the Bit 5 data coding mode indication of the first stage packet header 594 of FIG. 5.

In some cases, the respective coding information included in the first packet header can be indicative of: a Quad-Data-Macro (QDM) mode corresponding to sparsity-based compression based on structured sparsity or a non-QDM mode corresponding to sparsity-based compression based on random sparsity. For instance, the selection of QDM mode or non-QDM mode can be indicated based on the Bit 6 QDM mode indication of the first stage packet header 594 of FIG. 5. In some cases, the QDM mode can be implemented based on a QDM compression table that is the same as or similar to the QDM compression table 700 of FIG. 7 for structured sparsity.

In some examples, the QDM mode is associated with a plurality of structured sparsity patterns, each structured sparsity pattern of the plurality of structured sparsity patterns associated with a unique sequence of non-sparsity and sparsity bytes. For instance, the plurality of structured sparsity patterns can be the same as or similar to the eight data compression cases 1-8 of the QDM compression table 700 of FIG. 7, corresponding to each four-bit row of the QDM compression table 700 of FIG. 7. In some cases, each structured sparsity pattern of the plurality of structured sparsity patterns is associated with a corresponding QDM encoding indicative of the unique sequence. For instance, each structured sparsity pattern can be associated with a corresponding QDM encoding that is the same as or similar to the corresponding QDM encodings 750 for the eight data compression cases 1-8 for 2:4 structured sparsity represented in the QDM compression table 700 of FIG. 7.

In some cases, a corresponding QDM encoding for each compressed sub-packet of the plurality of compressed sub-packets can be included in a second packet header corresponding to respective sub-packet headers associated with each compressed sub-packet of the plurality of compressed sub-packets. For instance, the corresponding QDM encodings (e.g., the same as or similar to the QDM encodings 750 of FIG. 7) can be included in a second packet header that is the same as or similar to the second stage header 896 of FIG. 8 and/or the second stage header 996 of FIG. 9. In some examples, the QDM mode can associated with 2:4 structured sparsity corresponding to two instances of the configured sparsity value per four values included in the first sequence of values, the same as or similar to the 2:4 structured sparsity of QDM compression table 700 of FIG. 7.

In some examples, the respective coding information included in the first packet header can be indicative of a selection between a global sparsity value or a zero value for the configured sparsity value. In some cases, the respective coding information included in the first packet header can be indicative of a selection between a global sparsity value, a first configured sparsity value, or a second configured sparsity value. For instance, the respective coding information can be indicative of a selection between global sparsity values comprising one of the two configured sparsity values 592 of FIG. 9, one of the two configured sparsity values 692 of FIG. 6, one of the two configured sparsity values 892 of FIG. 8, and/or one of the two configured sparsity values 992 of FIG. 9. In some aspects, a greater or lesser number of global sparsity values (e.g., more or less than two) can be utilized and/or can be indicated in a respective global header.

In some cases, the first packet header can be further indicative of a respective masking value corresponding to each compressed sub-packet of the plurality of compressed sub-packets. For instance, the respective masking value can be the same as or similar to the masking value coding indication on Bit 3 of the first stage packet header 594 of FIG. 5, the masking value coding indication on Bit 2 of the first stage packet header 594 of FIG. 5, the masking value coding indication on Bit 1 of the first stage packet header 594 of FIG. 5, and/or the masking value coding indication on Bit 0 of the first stage packet header 594 of FIG. 5, etc. In some examples, wherein the respective masking value can be indicative of the corresponding compressed sub-packet including all sparsity bytes or the corresponding compressed sub-packet including at least one non-sparsity byte.

At block 1008, the process 1000 includes generating a compressed data packet, wherein the compressed data packet includes at least the first packet header, the first sub-packet header, and the one or more non-sparsity bytes included in the first sequence of values.

For example, the compressed data packet can be the same as or similar to the compressed data 590 of FIG. 9, the compressed data 690 of FIG. 6, the compressed data 890 of FIG. 8, and/or the compressed data 990 of FIG. 9, where a respective row of the compressed data corresponds to a compressed data packet. The first packet header can be the same as or similar to the first stage header 594 included in the compressed data 590 of FIG. 5 and the first sub-packet header can be the same as or similar to the second stage header 596 included in the compressed data 590 of FIG. 5. The first packet header can be the same as or similar to the first stage header 694 included in the compressed data 690 of FIG. 6 and the first sub-packet header can be the same as or similar to the second stage header 696 included in the compressed data 690 of FIG. 6. The first packet header can be the same as or similar to the first stage header 894 included in the compressed data 890 of FIG. 8 and the first sub-packet header can be the same as or similar to the second stage header 896 included in the compressed data 890 of FIG. 8. The first packet header can be the same as or similar to the first stage header 994 included in the compressed data 990 of FIG. 9 and the first sub-packet header can be the same as or similar to the second stage header 996 included in the compressed data 990 of FIG. 9.

In some cases, the compressed data packet can include the first packet header, a respective sub-packet header corresponding to each compressed sub-packet of the plurality of compressed sub-packets, and a respective one or more non-sparsity bytes included in a respective sequence of values corresponding to each compressed sub-packet of the plurality of compressed sub-packets. In some examples, the respective sub-packet header corresponding to each compressed sub-packet of the plurality of compressed sub-packets can be included in a second packet header associated with the compressed data packet. For instance, the respective sub-packet header corresponding to each compressed sub-packet of the plurality of sub-packets can be included in the second stage header 596 of FIG. 5, 696 of FIG. 6, 896 of FIG. 8, and/or 996 of FIG. 9.

In some examples, the compressed data packet further includes a second packet header, the second packet header including a respective sub-packet header corresponding to each compressed sub-packet of the plurality of compressed sub-packets. The respective sub-packet header corresponding to each compressed sub-packet of the plurality of compressed sub-packets can be indicative of corresponding location information of one or more sparsity bytes within a respective sequence of values associated with each compressed sub-packet of the plurality of compressed sub-packets. The second packet header can be indicative of sparsity location information for each respective compressed sub-packet of the plurality of compressed sub-packets. The second packet header can be indicative of a respective masking sequence for each compressed sub-packet of the plurality of compressed sub-packets, and wherein the respective masking sequence is indicative of bit-sequence location information of non-sparsity values within a respective sequence of values associated with each compressed sub-packet of the plurality of compressed sub-packets. The first packet header and the second packet header can be included in a two-stage packet header indicative of compression information corresponding to the compressed data packet.

In some examples, the compressed data packet further includes a global header associated with a plurality of compressed data packets including the compressed data packet. For instance, the global header can be the same as or similar to the global header 592 of FIG. 5, the global header 692 of FIG. 6, the global header 892 of FIG. 8, and/or the global header 992 of FIG. 9. In some cases, each respective compressed data packet of the plurality of compressed data packets can include a first packet header corresponding to a one or more compressed sub-packets included in the respective compressed data packet, and a second packet header corresponding to respective sub-packet headers of each compressed sub-packet of the one or more compressed sub-packets included in the respective compressed data packet.

In some cases, the process 1000 can further include generating a respective sub-packet header corresponding to each compressed sub-packet of the plurality of compressed sub-packets, and generating the compressed data packet to further include each respective subpacket header and one or more non-sparsity bytes included in a respective sequence of values corresponding to each compressed sub-packet of the plurality of compressed sub-packets.

In some examples, the respective sequence of values corresponding to each compressed sub-packet comprises an uncompressed sequence of values included in an input data, and wherein the compressed data packet and the plurality of compressed sub-packets correspond to the input data. In some cases, the compressed data packet further includes a global header indicative of at least the configured sparsity value. For instance, the global header 592 of FIG. 5, 692 of FIG. 6, 892 of FIG. 8, and/or 992 of FIG. 9 can be indicative of at least the configured sparsity value for the respective compressed data 590, 690, 890, and 890.

In some cases, the compressed data packet can further include a global header indicative of a first configured sparsity value and a second configured sparsity value different from the first configured sparsity value. The configured sparsity value for each compressed sub-packet of the plurality of compressed sub-packets can comprise one of the first configured sparsity value or the second configured sparsity value. In some instances, a first subset of the plurality of compressed sub-packets can be associated with a respective configured sparsity value equal to the first configured sparsity value, and a second subset of the plurality of compressed sub-packets can be associated with a respective configured sparsity value equal to the second configured sparsity value.

In some examples, the process 1000 further includes determining the configured sparsity value for the first compressed sub-packet based on the first sequence of values corresponding to the first sub-packet. The configured sparsity value can comprise a sparsity value having a highest frequency of occurrence within the first sequence of values.

In some examples, the processes described herein (e.g., process 1000, and/or any other process described herein) may be performed by a computing device or apparatus or a component or system (e.g., a chipset, one or more processors (e.g., CPU, GPU, NPU, DSP, etc.), ML system such as a neural network model, etc.) of the computing device or apparatus. In some examples, the process 1000 can be performed by a computing device or system having the computing device architecture 1300 of FIG. 13. The computing device, apparatus, or system can include any suitable device, such as a mobile device (e.g., a mobile phone), a desktop computing device, a tablet computing device, a wearable device (e.g., a VR headset, an AR headset, AR glasses, a network-connected watch or smartwatch, or other wearable device), a server computer, an autonomous vehicle or computing device of an autonomous vehicle, a robotic device, a laptop computer, a smart television, a camera, and/or any other computing device with the resource capabilities to perform the processes described herein, including the process 1000 and/or any other process described herein. In some cases, the computing device or apparatus may include various components, such as one or more input devices, one or more output devices, one or more processors, one or more microprocessors, one or more microcomputers, one or more cameras, one or more sensors, and/or other component(s) that are configured to carry out the steps of processes described herein. In some examples, the computing device may include a display, a network interface configured to communicate and/or receive the data, any combination thereof, and/or other component(s). The network interface may be configured to communicate and/or receive Internet Protocol (IP) based data or other type of data.

The components of the computing device can be implemented in circuitry. For example, the components can include and/or can be implemented using electronic circuits or other electronic hardware, which can include one or more programmable electronic circuits (e.g., microprocessors, graphics processing units (GPUs), digital signal processors (DSPs), central processing units (CPUs), and/or other suitable electronic circuits), and/or can include and/or be implemented using computer software, firmware, or any combination thereof, to perform the various operations described herein.

The process 1000 is illustrated as a logical flow diagram, the operation of which represents a sequence of operations that can be implemented in hardware, computer instructions, or a combination thereof. In the context of computer instructions, the operations represent computer-executable instructions stored on one or more computer-readable storage media that, when executed by one or more processors, perform the recited operations. Generally, computer-executable instructions include routines, programs, objects, components, data structures, and the like that perform particular functions or implement particular data types. The order in which the operations are described is not intended to be construed as a limitation, and any number of the described operations can be combined in any order and/or in parallel to implement the processes.

Additionally, the process 1000 and/or any other process described herein may be performed under the control of one or more computer systems configured with executable instructions and may be implemented as code (e.g., executable instructions, one or more computer programs, or one or more applications) executing collectively on one or more processors, by hardware, or combinations thereof. As noted above, the code may be stored on a computer-readable or machine-readable storage medium, for example, in the form of a computer program comprising a plurality of instructions executable by one or more processors. The computer-readable or machine-readable storage medium may be non-transitory.

Figure 11:
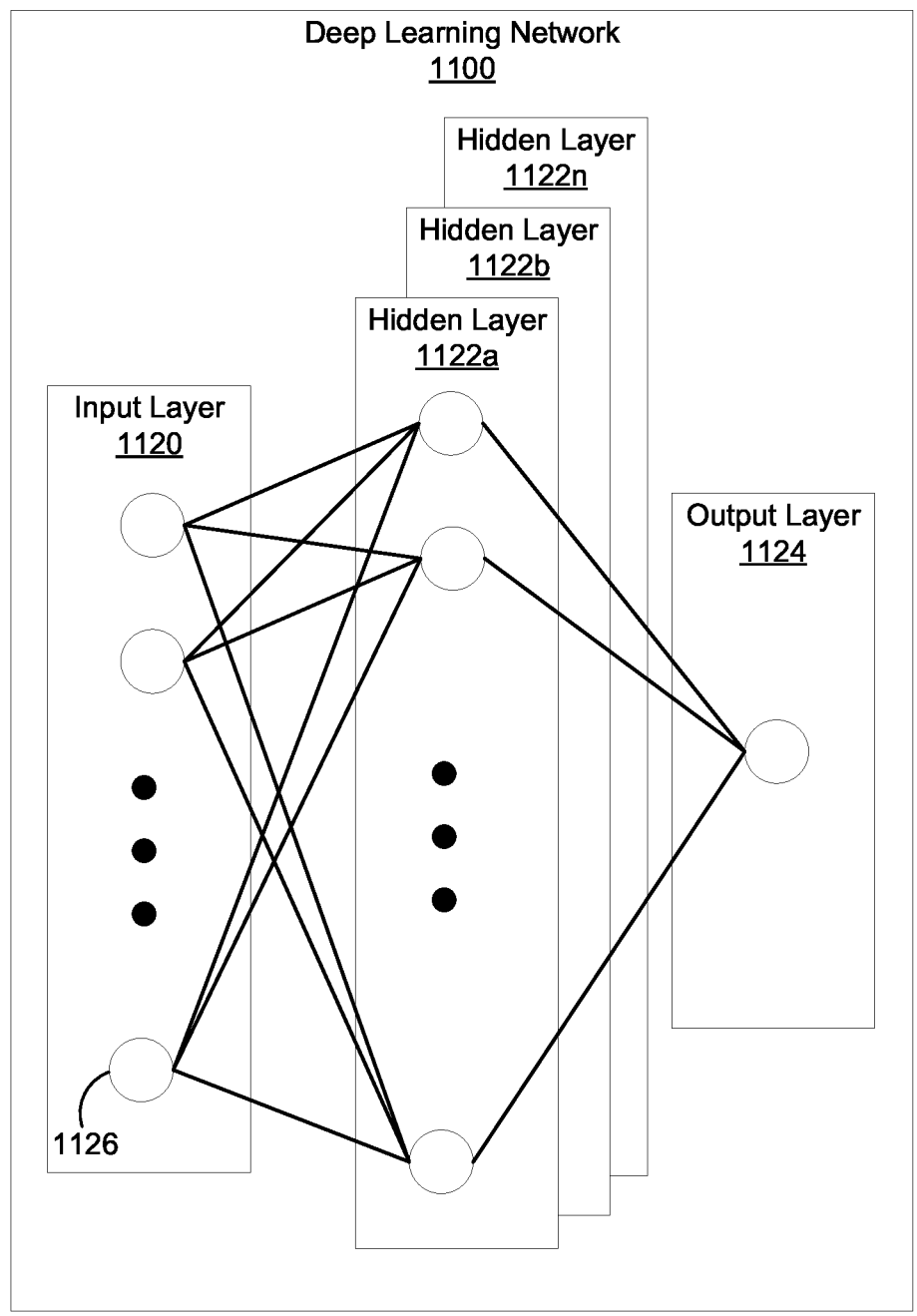
FIG. 11 is a block diagram illustrating an example of a deep learning network, in accordance with some examples.

FIG. 11 is an example of a deep learning neural network 1100. An input layer 1120 includes input data. In some cases, the input layer 1120 can include data representing the pixels of an input video frame. The neural network 1100 includes multiple hidden layers 1122*a*, 1122*b*, through 1122*n*. The hidden layers 1122*a*, 1122*b*, through 1122*n* include "n" number of hidden layers, where "n" is an integer greater than or equal to one. The number of hidden layers can be made to include as many layers as needed for the given application. The neural network 1100 further includes an output layer 1124 that provides an output resulting from the processing performed by the hidden layers 1122*a*, 1122*b*, through 1122*n*. In some aspects, the output layer 1124 can provide a classification for an object in an input video frame. The classification can include a class identifying the type of object (e.g., a person, a dog, a cat, or other object).

The neural network 1100 is a multi-layer neural network of interconnected nodes. Each node can represent a piece of information. Information associated with the nodes is shared among the different layers and each layer retains information as information is processed. In some cases, the neural network 1100 can include a feed-forward network, in which case there are no feedback connections where outputs of the network are fed back into itself. In some cases, the neural network 1100 can include a recurrent neural network, which can have loops that allow information to be carried across nodes while reading in input.

Information can be exchanged between nodes through node-to-node interconnections between the various layers. Nodes of the input layer 1120 can activate a set of nodes in the first hidden layer 1122*a*. For example, as shown, each of the input nodes of the input layer 1120 is connected to each of the nodes of the first hidden layer 1122*a*. The nodes of the hidden layers 1122*a*, 1122*b*, through 1122*n* can transform the information of each input node by applying activation functions to the information. The information derived from the transformation can then be passed to and can activate the nodes of the next hidden layer 1122*b*, which can perform their own designated functions. Example functions include convolutional, up-sampling, data transformation, and/or any other suitable functions. The output of the hidden layer 1122*b* can then activate nodes of the next hidden layer, and so on. The output of the last hidden layer 1122*n* can activate one or more nodes of the output layer 1124, at which an output is provided. In some cases, while nodes (e.g., node 1126) in the neural network 1100 are shown as having multiple output lines, a node has a single output and all lines shown as being output from a node represent the same output value.

In some cases, each node or interconnection between nodes can have a weight that is a set of parameters derived from the training of the neural network 1100. Once the neural network 1100 is trained, it can be referred to as a trained neural network, which can be used to classify one or more objects. For example, an interconnection between nodes can represent a piece of information learned about the interconnected nodes. The interconnection can have a tunable numeric weight that can be tuned (e.g., based on a training dataset), allowing the neural network 1100 to be adaptive to inputs and able to learn as more and more data is processed.

The neural network 1100 is pre-trained to process the features from the data in the input layer 1120 using the different hidden layers 1122*a*, 1122*b*, through 1122*n* in order to provide the output through the output layer 1124. In examples in which the neural network 1100 is used to identify objects in images, the neural network 1100 can be trained using training data that includes both images and labels. For instance, training images can be input into the network, with each training image having a label indicating the classes of the one or more objects in each image (basically, indicating to the network what the objects are and what features they have). In some examples, a training image can include an image of a number 2, in which case the label for the image can be [00 1000000 0].

In some cases, the neural network 1100 can adjust the weights of the nodes using a training process called backpropagation. Backpropagation can include a forward pass, a loss function, a backward pass, and a weight update. The forward pass, loss function, backward pass, and parameter update is performed for one training iteration. The process can be repeated for a certain number of iterations for each set of training images until the neural network 1100 is trained well enough so that the weights of the layers are accurately tuned.

For examples of identifying objects in images, the forward pass can include passing a training image through the neural network 1100. The weights are initially randomized before the neural network 1100 is trained. The image can include, for example, an array of numbers representing the pixels of the image. Each number in the array can include a value from 0 to 255 describing the pixel intensity at that position in the array. In some examples, the array can include a 28×28×3 array of numbers with 28 rows and 28 columns of pixels and 3 color components (such as red, green, and blue, or luma and two chroma components, or the like).

For a first training iteration for the neural network 1100, the output will likely include values that do not give preference to any particular class due to the weights being randomly selected at initialization. For example, if the output is a vector with probabilities that the object includes different classes, the probability value for each of the different classes may be equal or at least very similar (e.g., for ten possible classes, each class may have a probability value of 0.1). With the initial weights, the neural network 1100 is unable to determine low level features and thus cannot make an accurate determination of what the classification of the object might be. A loss function can be used to analyze error in the output. Any suitable loss function definition can be used. An example of a loss function includes a mean squared error (MSE). The MSE is defined as $$E_{total} = \sum \frac{1}{2}(\text{target} - \text{output})^2,$$

which calculates the sum of one-half times a ground truth output (e.g., the actual answer) minus the predicted output (e.g., the predicted answer) squared. The loss can be set to be equal to the value of $E_{total}$.

The loss (or error) will be high for the first training images since the actual values will be much different than the predicted output. The goal of training is to minimize the amount of loss so that the predicted output is the same as the training label. The neural network 1100 can perform a backward pass by determining which inputs (weights) most contributed to the loss of the network, and can adjust the weights so that the loss decreases and is eventually minimized.

A derivative of the loss with respect to the weights (denoted as dL/dW, where W are the weights at a particular layer) can be computed to determine the weights that contributed most to the loss of the network. After the derivative is computed, a weight update can be performed by updating all the weights of the filters. For example, the weights can be updated so that they change in the opposite direction of the gradient. The weight update can be denoted as $$w = w_i - \eta \frac{dL}{dW},$$

where w denotes a weight, w, denotes the initial weight, and n denotes a learning rate. The learning rate can be set to any suitable value, with a high learning rate including larger weight updates and a lower value indicating smaller weight updates.

The neural network 1100 can include any suitable deep network. Examples include a convolutional neural network (CNN), which includes an input layer and an output layer, with multiple hidden layers between the input and out layers. An example of a CNN is described below with respect to FIG. 12. The hidden layers of a CNN include a series of convolutional, nonlinear, pooling (for downsampling), and fully connected layers. The neural network 1100 can include any other deep network other than a CNN, such as an autoencoder, a deep belief nets (DBNs), a Recurrent Neural Networks (RNNs), among others.

Figure 12:
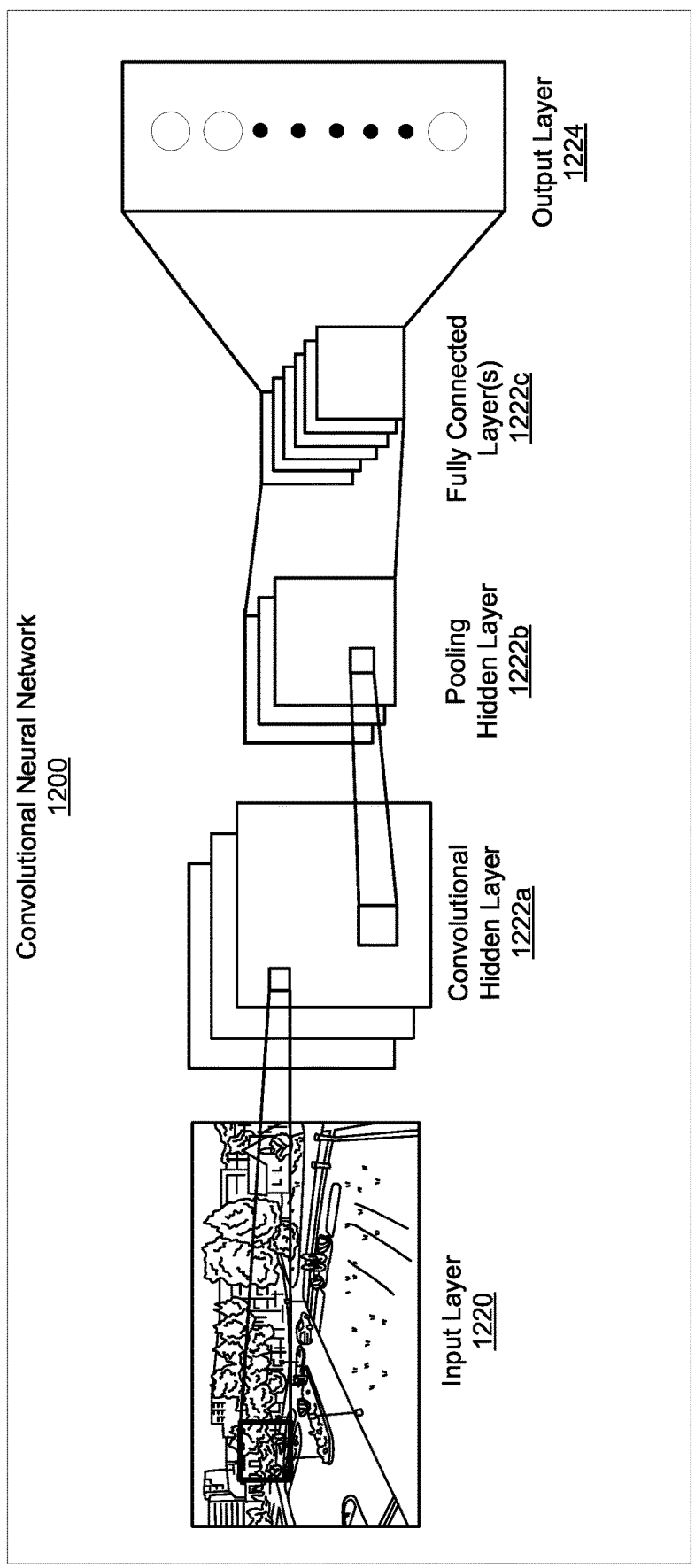
FIG. 12 is a block diagram illustrating an example of a convolutional neural network, in accordance with some examples.

FIG. 12 is an example of a convolutional neural network 1200 (CNN 1200). The input layer 1220 of the CNN 1200 includes data representing an image. For example, the data can include an array of numbers representing the pixels of the image, with each number in the array including a value from 0 to 255 describing the pixel intensity at that position in the array. Using the previous example from above, the array can include a 28×28×3 array of numbers with 28 rows and 28 columns of pixels and 3 color components (e.g., red, green, and blue, or luma and two chroma components, or the like). The image can be passed through a convolutional hidden layer 1222a, an optional non-linear activation layer, a pooling hidden layer 1222b, and fully connected hidden layers 1222c to get an output at the output layer 1224. While only one of each hidden layer is shown in FIG. 12, one of ordinary skill will appreciate that multiple convolutional hidden layers, non-linear layers, pooling hidden layers, and/or fully connected layers can be included in the CNN 1200. As previously described, the output can indicate a single class of an object or can include a probability of classes that best describe the object in the image.

The first layer of the CNN 1200 is the convolutional hidden layer 1222a. The convolutional hidden layer 1222a analyzes the image data of the input layer 1220. Each node of the convolutional hidden layer 1222a is connected to a region of nodes (pixels) of the input image called a receptive field. The convolutional hidden layer 1222a can be considered as one or more filters (each filter corresponding to a different activation or feature map), with each convolutional iteration of a filter being a node or neuron of the convolutional hidden layer 1222a. For example, the region of the input image that a filter covers at each convolutional iteration would be the receptive field for the filter. In some aspects, if the input image includes a 28×28 array, and each filter (and corresponding receptive field) is a 5×5 array, then there will be 24×24 nodes in the convolutional hidden layer 1222a. Each connection between a node and a receptive field for that node learns a weight and, in some cases, an overall bias such that each node learns to analyze its particular local receptive field in the input image. Each node of the hidden layer 1222a will have the same weights and bias (called a shared weight and a shared bias). For example, the filter has an array of weights (numbers) and the same depth as the input. A filter will have a depth of 3 for the video frame example (according to three color components of the input image). An example size of the filter array is 5×5×3, corresponding to a size of the receptive field of a node.

The convolutional nature of the convolutional hidden layer 1222a is due to each node of the convolutional layer being applied to its corresponding receptive field. For example, a filter of the convolutional hidden layer 1222a can begin in the top-left corner of the input image array and can convolve around the input image. As noted above, each convolutional iteration of the filter can be considered a node or neuron of the convolutional hidden layer 1222a. At each convolutional iteration, the values of the filter are multiplied with a corresponding number of the original pixel values of the image (e.g., the 5×5 filter array is multiplied by a 5×5 array of input pixel values at the top-left corner of the input image array). The multiplications from each convolutional iteration can be summed together to obtain a total sum for that iteration or node. The process is next continued at a next location in the input image according to the receptive field of a next node in the convolutional hidden layer 1222a.

For example, a filter can be moved by a step amount to the next receptive field. The step amount can be set to 1 or other suitable amount. For example, if the step amount is set to 1, the filter will be moved to the right by 1 pixel at each convolutional iteration. Processing the filter at each unique location of the input volume produces a number representing the filter results for that location, resulting in a total sum value being determined for each node of the convolutional hidden layer 1222a.

The mapping from the input layer to the convolutional hidden layer 1222a is referred to as an activation map (or feature map). The activation map includes a value for each node representing the filter results at each locations of the input volume. The activation map can include an array that includes the various total sum values resulting from each iteration of the filter on the input volume. For example, the activation map will include a 24×24 array if a 5×5 filter is applied to each pixel (a step amount of 1) of a 28×28 input image. The convolutional hidden layer 1222a can include several activation maps in order to identify multiple features in an image. The example shown in FIG. 12 includes three activation maps. Using three activation maps, the convolutional hidden layer 1222a can detect three different kinds of features, with each feature being detectable across the entire image.

In some examples, a non-linear hidden layer can be applied after the convolutional hidden layer 1222a. The non-linear layer can be used to introduce non-linearity to a system that has been computing linear operations. In some examples, a non-linear layer can be a rectified linear unit (ReLU) layer. A ReLU layer can apply the function f(x) =max (0, x) to all of the values in the input volume, which changes all the negative activations to 0. The ReLU can thus increase the non-linear properties of the CNN 1200 without affecting the receptive fields of the convolutional hidden layer 1222a.

The pooling hidden layer 1222b can be applied after the convolutional hidden layer 1222a (and after the non-linear hidden layer when used). The pooling hidden layer 1222b is used to simplify the information in the output from the convolutional hidden layer 1222a. For example, the pooling hidden layer 1222b can take each activation map output from the convolutional hidden layer 1222a and generates a condensed activation map (or feature map) using a pooling function. Max-pooling is an example of a function performed by a pooling hidden layer. Other forms of pooling functions be used by the pooling hidden layer 1222a, such as average pooling, L2-norm pooling, or other suitable pooling functions. A pooling function (e.g., a max-pooling filter, an L2-norm filter, or other suitable pooling filter) is applied to each activation map included in the convolutional hidden layer 1222a. In the example shown in FIG. 12, three pooling filters are used for the three activation maps in the convolutional hidden layer 1222a.

In some examples, max-pooling can be used by applying a max-pooling filter (e.g., having a size of 2×2) with a step amount (e.g., equal to a dimension of the filter, such as a step amount of 2) to an activation map output from the convolutional hidden layer 1222a. The output from a max-pooling filter includes the maximum number in every sub-region that the filter convolves around. Using a 2×2 filter as an example, each unit in the pooling layer can summarize a region of 2×2 nodes in the previous layer (with each node being a value in the activation map). For example, four values (nodes) in an activation map will be analyzed by a 2×2 max-pooling filter at each iteration of the filter, with the maximum value from the four values being output as the "max" value. If such a max-pooling filter is applied to an activation filter from the convolutional hidden layer 1222a having a dimension of 24×24 nodes, the output from the pooling hidden layer 1222b will be an array of 12×12 nodes.

In some examples, an L2-norm pooling filter could also be used. The L2-norm pooling filter includes computing the square root of the sum of the squares of the values in the 2×2 region (or other suitable region) of an activation map (instead of computing the maximum values as is done in max-pooling), and using the computed values as an output.

Intuitively, the pooling function (e.g., max-pooling, L2-norm pooling, or other pooling function) determines whether a given feature is found anywhere in a region of the image, and discards the exact positional information. This can be done without affecting results of the feature detection because, once a feature has been found, the exact location of the feature is not as important as its approximate location relative to other features. Max-pooling (as well as other pooling methods) offer the benefit that there are many fewer pooled features, thus reducing the number of parameters needed in later layers of the CNN 1200.

The final layer of connections in the network is a fully-connected layer that connects every node from the pooling hidden layer 1222b to every one of the output nodes in the output layer 1224. Using the example above, the input layer includes 28×28 nodes encoding the pixel intensities of the input image, the convolutional hidden layer 1222a includes 3×24×24 hidden feature nodes based on application of a 5×5 local receptive field (for the filters) to three activation maps, and the pooling layer 1222b includes a layer of 3×12×12 hidden feature nodes based on application of max-pooling filter to 2×2 regions across each of the three feature maps. Extending this example, the output layer 1224 can include ten output nodes. In such an example, every node of the 3×12×12 pooling hidden layer 1222b is connected to every node of the output layer 1224.

The fully connected layer 1222c can obtain the output of the previous pooling layer 1222b (which should represent the activation maps of high-level features) and determines the features that most correlate to a particular class. For example, the fully connected layer 1222c layer can determine the high-level features that most strongly correlate to a particular class, and can include weights (nodes) for the high-level features. A product can be computed between the weights of the fully connected layer 1222c and the pooling hidden layer 1222b to obtain probabilities for the different classes. For example, if the CNN 1200 is being used to predict that an object in a video frame is a person, high values will be present in the activation maps that represent high-level features of people (e.g., two legs are present, a face is present at the top of the object, two eyes are present at the top left and top right of the face, a nose is present in the middle of the face, a mouth is present at the bottom of the face, and/or other features common for a person).

In some examples, the output from the output layer 1224 can include an M-dimensional vector (in the prior example, M=10), where M can include the number of classes that the program has to choose from when classifying the object in the image. Other example outputs can also be provided. Each number in the N-dimensional vector can represent the probability the object is of a certain class. In some cases, if a 10-dimensional output vector represents ten different classes of objects is [0 0 0.05 0.8 0 0.15 0 0 0 0], the vector indicates that there is a 5% probability that the image is the third class of object (e.g., a dog), an 80% probability that the image is the fourth class of object (e.g., a human), and a 15% probability that the image is the sixth class of object (e.g., a kangaroo). The probability for a class can be considered a confidence level that the object is part of that class.

Figure 13:
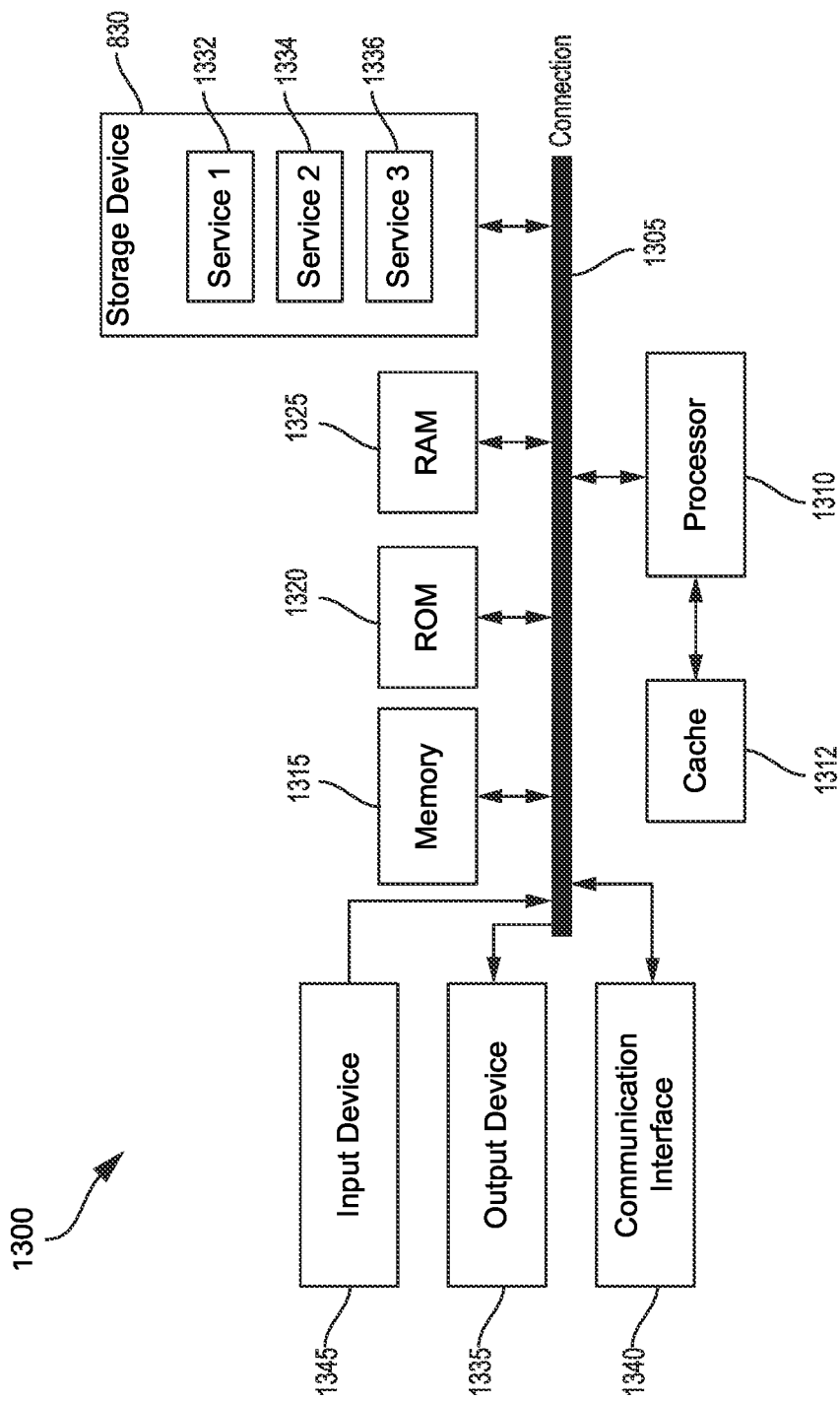
FIG. 13 is a diagram illustrating an example system architecture for implementing certain aspects described herein.

FIG. 13 illustrates an example computing device architecture 1300 of an example computing device which can implement the various techniques described herein. In some examples, the computing device can include a mobile device, a wearable device, an extended reality device (e.g., a virtual reality (VR) device, an augmented reality (AR) device, or a mixed reality (MR) device), a personal computer, a laptop computer, a video server, a vehicle (or computing device of a vehicle), or other device. The components of computing device architecture 1300 are shown in electrical communication with each other using connection 1305, such as a bus. The example computing device architecture 1300 includes a processing unit (CPU or processor) 1310 and computing device connection 1305 that couples various computing device components including computing device memory 1315, such as read only memory (ROM) 1320 and random-access memory (RAM) 1325, to processor 1310.

Computing device architecture 1300 can include a cache of high-speed memory connected directly with, in close proximity to, or integrated as part of processor 1310. Computing device architecture 1300 can copy data from memory 1315 and/or the storage device 1330 to cache 1312 for quick access by processor 1310. In this way, the cache can provide a performance boost that avoids processor 1310 delays while waiting for data. These and other engines can control or be configured to control processor 1310 to perform various actions. Other computing device memory 1315 may be available for use as well. Memory 1315 can include multiple different types of memory with different performance characteristics. Processor 1310 can include any general-purpose processor and a hardware or software service, such as service 1 1332, service 2 1334, and service 3 1336 stored in storage device 1330, configured to control processor 1310 as well as a special-purpose processor where software instructions are incorporated into the processor design. Processor 1310 may be a self-contained system, containing multiple cores or processors, a bus, memory controller, cache, etc. A multi-core processor may be symmetric or asymmetric.

To enable user interaction with the computing device architecture 1300, input device 1345 can represent any number of input mechanisms, such as a microphone for speech, a touch-sensitive screen for gesture or graphical input, keyboard, mouse, motion input, speech and so forth. Output device 1335 can also be one or more of a number of output mechanisms known to those of skill in the art, such as a display, projector, television, speaker device, etc. In some instances, multimodal computing devices can enable a user to provide multiple types of input to communicate with computing device architecture 1300. Communication interface 1340 can generally govern and manage the user input and computing device output. There is no restriction on operating on any particular hardware arrangement and therefore the basic features here may easily be substituted for improved hardware or firmware arrangements as they are developed.

Storage device 1330 is a non-volatile memory and can be a hard disk or other types of computer readable media which can store data that are accessible by a computer, such as magnetic cassettes, flash memory cards, solid state memory devices, digital versatile disks, cartridges, random access memories (RAMs) 1325, read only memory (ROM) 1320, and hybrids thereof. Storage device 1330 can include services 1332, 1334, 1336 for controlling processor 1310. Other hardware or software modules or engines are contemplated. Storage device 1330 can be connected to the computing device connection 1305. In some aspects, a hardware module that performs a particular function can include the software component stored in a computer-readable medium in connection with the necessary hardware components, such as processor 1310, connection 1305, output device 1335, and so forth, to carry out the function.

Aspects of the present disclosure are applicable to any suitable electronic device (such as security systems, smartphones, tablets, laptop computers, vehicles, drones, or other devices) including or coupled to one or more active depth sensing systems. While described below with respect to a device having or coupled to one light projector, aspects of the present disclosure are applicable to devices having any number of light projectors and are therefore not limited to specific devices.

The term "device" is not limited to one or a specific number of physical objects (such as one smartphone, one controller, one processing system and so on). As used herein, a device may be any electronic device with one or more parts that may implement at least some portions of this disclosure. While the below description and examples use the term "device" to describe various aspects of this disclosure, the term "device" is not limited to a specific configuration, type, or number of objects. Additionally, the term "system" is not limited to multiple components or specific aspects. For example, a system may be implemented on one or more printed circuit boards or other substrates and may have movable or static components. While the below description and examples use the term "system" to describe various aspects of this disclosure, the term "system" is not limited to a specific configuration, type, or number of objects.

Specific details are provided in the description above to provide a thorough understanding of the aspects and examples provided herein. However, it will be understood by one of ordinary skill in the art that the aspects may be practiced without these specific details. For clarity of explanation, in some instances the present technology may be presented as including individual functional blocks including functional blocks comprising devices, device components, steps or routines in a method embodied in software, or combinations of hardware and software. Additional components may be used other than those shown in the figures and/or described herein. For example, circuits, systems, networks, processes, and other components may be shown as components in block diagram form in order not to obscure the aspects in unnecessary detail. In other instances, well-known circuits, processes, algorithms, structures, and techniques may be shown without unnecessary detail in order to avoid obscuring the aspects.

Individual aspects may be described above as a process or method which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

Processes and methods according to the above-described examples can be implemented using computer-executable instructions that are stored or otherwise available from computer-readable media. Such instructions can include, for example, instructions and data which cause or otherwise configure a general-purpose computer, special purpose computer, or a processing device to perform a certain function or group of functions. Portions of computer resources used can be accessible over a network. The computer executable instructions may be, for example, binaries, intermediate format instructions such as assembly language, firmware, source code, etc.

The term "computer-readable medium" includes, but is not limited to, portable or non-portable storage devices, optical storage devices, and various other mediums capable of storing, containing, or carrying instruction(s) and/or data. A computer-readable medium may include a non-transitory medium in which data can be stored and that does not include carrier waves and/or transitory electronic signals propagating wirelessly or over wired connections. Examples of a non-transitory medium may include, but are not limited to, a magnetic disk or tape, optical storage media such as flash memory, memory or memory devices, magnetic or optical disks, flash memory, USB devices provided with non-volatile memory, networked storage devices, compact disk (CD) or digital versatile disk (DVD), any suitable combination thereof, among others. A computer-readable medium may have stored thereon code and/or machine-executable instructions that may represent a procedure, a function, a subprogram, a program, a routine, a subroutine, a module, an engine, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, or the like.

In some aspects the computer-readable storage devices, mediums, and memories can include a cable or wireless signal containing a bit stream and the like. However, when mentioned, non-transitory computer-readable storage media expressly exclude media such as energy, carrier signals, electromagnetic waves, and signals per se.

Devices implementing processes and methods according to these disclosures can include hardware, software, firmware, middleware, microcode, hardware description languages, or any combination thereof, and can take any of a variety of form factors. When implemented in software, firmware, middleware, or microcode, the program code or code segments to perform the necessary tasks (e.g., a computer-program product) may be stored in a computer-readable or machine-readable medium. A processor(s) may perform the necessary tasks. Typical examples of form factors include laptops, smart phones, mobile phones, tablet devices or other small form factor personal computers, personal digital assistants, rackmount devices, standalone devices, and so on. Functionality described herein also can be embodied in peripherals or add-in cards. Such functionality can also be implemented on a circuit board among different chips or different processes executing in a single device, by way of further example.

The instructions, media for conveying such instructions, computing resources for executing them, and other structures for supporting such computing resources are example means for providing the functions described in the disclosure.

In the foregoing description, aspects of the application are described with reference to specific aspects thereof, but those skilled in the art will recognize that the application is not limited thereto. Thus, while illustrative aspects of the application have been described in detail herein, it is to be understood that the inventive concepts may be otherwise variously embodied and employed, and that the appended claims are intended to be construed to include such variations, except as limited by the prior art. Various features and aspects of the above-described application may be used individually or jointly. Further, aspects can be utilized in any number of environments and applications beyond those described herein without departing from the broader spirit and scope of the specification. The specification and drawings are, accordingly, to be regarded as illustrative rather than restrictive. For the purposes of illustration, methods were described in a particular order. It should be appreciated that in alternate aspects, the methods may be performed in a different order than that described.

One of ordinary skill will appreciate that the less than ("<") and greater than (">") symbols or terminology used herein can be replaced with less than or equal to ("≤") and greater than or equal to ("≥") symbols, respectively, without departing from the scope of this description.

Where components are described as being "configured to" perform certain operations, such configuration can be accomplished, for example, by designing electronic circuits or other hardware to perform the operation, by programming programmable electronic circuits (e.g., microprocessors, or other suitable electronic circuits) to perform the operation, or any combination thereof.

The phrase "coupled to" refers to any component that is physically connected to another component either directly or indirectly, and/or any component that is in communication with another component (e.g., connected to the other component over a wired or wireless connection, and/or other suitable communication interface) either directly or indirectly.

The various illustrative logical blocks, modules, engines, circuits, and algorithm steps described in connection with the aspects disclosed herein may be implemented as electronic hardware, computer software, firmware, or combinations thereof. To clearly illustrate this interchangeability of hardware and software, various illustrative components, blocks, modules, engines, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present application.

The techniques described herein may also be implemented in electronic hardware, computer software, firmware, or any combination thereof. Such techniques may be implemented in any of a variety of devices such as general purposes computers, wireless communication device handsets, or integrated circuit devices having multiple uses including application in wireless communication device handsets and other devices. Any features described as modules or components may be implemented together in an integrated logic device or separately as discrete but interoperable logic devices. If implemented in software, the techniques may be realized at least in part by a computer-readable data storage medium comprising program code including instructions that, when executed, performs one or more of the methods described above. The computer-readable data storage medium may form part of a computer program product, which may include packaging materials. The computer-readable medium may comprise memory or data storage media, such as random-access memory (RAM) such as synchronous dynamic random-access memory (SDRAM), read-only memory (ROM), non-volatile random-access memory (NVRAM), electrically erasable programmable read-only memory (EEPROM), FLASH memory, magnetic or optical data storage media, and the like. The techniques additionally, or alternatively, may be realized at least in part by a computer-readable communication medium that carries or communicates program code in the form of instructions or data structures and that can be accessed, read, and/or executed by a computer, such as propagated signals or waves.

The program code may be executed by a processor, which may include one or more processors, such as one or more digital signal processors (DSPs), general purpose microprocessors, an application specific integrated circuits (ASICs), field programmable logic arrays (FPGAs), or other equivalent integrated or discrete logic circuitry. Such a processor may be configured to perform any of the techniques described in this disclosure. A general-purpose processor may be a microprocessor; but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Accordingly, the term "processor," as used herein may refer to any of the foregoing structure, any combination of the foregoing structure, or any other structure or apparatus suitable for implementation of the techniques described herein.

Claim language or other language reciting "at least one of" a set and/or "one or more" of a set indicates that one member of the set or multiple members of the set (in any combination) satisfy the claim. For example, claim language reciting "at least one of A and B" or "at least one of A or B" means A, B, or A and B. In another example, claim language reciting "at least one of A, B, and C" or "at least one of A, B, or C" means A, B, C, or A and B, or A and C, or B and C, A and B and C, or any duplicate information or data (e.g., A and A, B and B, C and C, A and A and B, and so on), or any other ordering, duplication, or combination of A, B, and C. The language "at least one of" a set and/or "one or more"

of a set does not limit the set to the items listed in the set. For example, claim language reciting "at least one of A and B" or "at least one of A or B" may mean A, B, or A and B, and may additionally include items not listed in the set of A and B. The phrases "at least one" and "one or more" are used interchangeably herein.

Claim language or other language reciting "at least one processor configured to," "at least one processor being configured to," "one or more processors configured to," "one or more processors being configured to," or the like indicates that one processor or multiple processors (in any combination) can perform the associated operation(s). For example, claim language reciting "at least one processor configured to: X, Y, and Z" means a single processor can be used to perform operations X, Y, and Z; or that multiple processors are each tasked with a certain subset of operations X, Y, and Z such that together the multiple processors perform X, Y, and Z; or that a group of multiple processors work together to perform operations X, Y, and Z. In another example, claim language reciting "at least one processor configured to: X, Y, and Z" can mean that any single processor may only perform at least a subset of operations X, Y, and Z.

Where reference is made to one or more elements performing functions (e.g., steps of a method), one element may perform all functions, or more than one element may collectively perform the functions. When more than one element collectively performs the functions, each function need not be performed by each of those elements (e.g., different functions may be performed by different elements) and/or each function need not be performed in whole by only one element (e.g., different elements may perform different sub-functions of a function). Similarly, where reference is made to one or more elements configured to cause another element (e.g., an apparatus) to perform functions, one element may be configured to cause the other element to perform all functions, or more than one element may collectively be configured to cause the other element to perform the functions.

Where reference is made to an entity (e.g., any entity or device described herein) performing functions or being configured to perform functions (e.g., steps of a method), the entity may be configured to cause one or more elements (individually or collectively) to perform the functions. The one or more components of the entity may include at least one memory, at least one processor, at least one communication interface, another component configured to perform one or more (or all) of the functions, and/or any combination thereof. Where reference to the entity performing functions, the entity may be configured to cause one component to perform all functions, or to cause more than one component to collectively perform the functions. When the entity is configured to cause more than one component to collectively perform the functions, each function need not be performed by each of those components (e.g., different functions may be performed by different components) and/or each function need not be performed in whole by only one component (e.g., different components may perform different sub-functions of a function).

Illustrative aspects of the disclosure include:

Aspect 1. An apparatus for compressing data, comprising: at least one memory; and at least one processor coupled to the at least one memory, the at least one processor configured to: generate a first compressed sub-packet based on removing one or more sparsity bytes from a first sequence of values corresponding to a first sub-packet, wherein the first sequence of values includes one or more sparsity bytes each equal to a configured sparsity value and one or more non-sparsity bytes each corresponding to a respective data value different from the configured sparsity value; generate a first sub-packet header corresponding to the first compressed sub-packet, wherein the first sub-packet header is indicative of a respective location within the first sequence of values of each non-sparsity byte of the one or more non-sparsity bytes; generate a first packet header corresponding to a plurality of compressed sub-packets including the first compressed sub-packet, wherein the first packet header is indicative of the configured sparsity value and respective coding information corresponding to each compressed sub-packet of the plurality of compressed sub-packets; and generate a compressed data packet, wherein the compressed data packet includes at least the first packet header, the first sub-packet header, and the one or more non-sparsity bytes included in the first sequence of values.

Aspect 2. The apparatus of Aspect 1, wherein the compressed data packet includes the first packet header, a respective sub-packet header corresponding to each compressed sub-packet of the plurality of compressed sub-packets, and a respective one or more non-sparsity bytes included in a respective sequence of values corresponding to each compressed sub-packet of the plurality of compressed sub-packets.

Aspect 3. The apparatus of Aspect 2, wherein the respective sub-packet header corresponding to each compressed sub-packet of the plurality of compressed sub-packets is included in a second packet header associated with the compressed data packet.

Aspect 4. The apparatus of any of Aspects 1 to 3, wherein the compressed data packet further includes a second packet header, the second packet header including a respective sub-packet header corresponding to each compressed sub-packet of the plurality of compressed sub-packets.

Aspect 5. The apparatus of Aspect 4, wherein the respective sub-packet header corresponding to each compressed sub-packet of the plurality of compressed sub-packets is indicative of corresponding location information of one or more sparsity bytes within a respective sequence of values associated with each compressed sub-packet of the plurality of compressed sub-packets.

Aspect 6. The apparatus of any of Aspects 4 to 5, wherein the second packet header is indicative of sparsity location information for each respective compressed sub-packet of the plurality of compressed sub-packets.

Aspect 7. The apparatus of any of Aspects 4 to 6, wherein the second packet header is indicative of a respective masking sequence for each compressed sub-packet of the plurality of compressed sub-packets, and wherein the respective masking sequence is indicative of bit-sequence location information of non-sparsity values within a respective sequence of values associated with each compressed sub-packet of the plurality of compressed sub-packets.

Aspect 8. The apparatus of any of Aspects 4 to 7, wherein the first packet header and the second packet header are included in a two-stage packet header indicative of compression information corresponding to the compressed data packet.

Aspect 9. The apparatus of any of Aspects 1 to 8, wherein the compressed data packet further includes a global header associated with a plurality of compressed data packets including the compressed data packet.

Aspect 10. The apparatus of Aspect 9, wherein each respective compressed data packet of the plurality of compressed data packets includes: a respective first packet header corresponding to a one or more compressed sub-packets included in the respective compressed data packet;

and a respective second packet header corresponding to respective sub-packet headers of each compressed sub-packet of the one or more compressed sub-packets included in the respective compressed data packet.

Aspect 11. The apparatus of any of Aspects 1 to 10, wherein the respective coding information included in the first packet header is indicative of a data packing mode associated with each compressed sub-packet of the plurality of compressed sub-packets corresponding to the compressed data packet.

Aspect 12. The apparatus of Aspect 11, wherein the respective coding information is indicative of: an 8-bit data packing mode corresponding to an 8-byte sub-packet size and corresponding to four 8-byte sub-packets per compressed data packet, each 8-byte sub-packet including eight values; or a 16-bit data packing mode corresponding to a 16-byte sub-packet size and corresponding to two 16-byte sub-packets per compressed data packet, each 16-byte sub-packet including eight values.

Aspect 13. The apparatus of any of Aspects 1 to 12, wherein the respective coding information included in the first packet header is indicative of a selection between a 4-bit, 8-bit, or 16-bit data packing mode associated with the plurality of compressed sub-packets.

Aspect 14. The apparatus of any of Aspects 1 to 13, wherein the respective coding information included in the first packet header is indicative of: a Quad-Data-Macro (QDM) mode corresponding to sparsity-based compression based on structured sparsity or a non-QDM mode corresponding to sparsity-based compression based on random sparsity.

Aspect 15. The apparatus of Aspect 14, wherein the QDM mode is associated with a plurality of structured sparsity patterns, each structured sparsity pattern of the plurality of structured sparsity patterns associated with a unique sequence of non-sparsity and sparsity bytes.

Aspect 16. The apparatus of Aspect 15, wherein each structured sparsity pattern of the plurality of structured sparsity patterns is associated with a corresponding QDM encoding pattern indicative of the unique sequence.

Aspect 17. The apparatus of Aspect 16, wherein a corresponding QDM encoding pattern for each compressed sub-packet of the plurality of compressed sub-packets is included in a second packet header corresponding to respective sub-packet headers associated with each compressed sub-packet of the plurality of compressed sub-packets.

Aspect 18. The apparatus of any of Aspects 14 to 17, wherein the QDM mode is associated with 2:4 structured sparsity corresponding to two instances of the configured sparsity value per four values included in the first sequence of values.

Aspect 19. The apparatus of any of Aspects 1 to 18, wherein the respective coding information included in the first packet header is indicative of a selection between a global sparsity value or a zero value for the configured sparsity value.

Aspect 20. The apparatus of any of Aspects 1 to 19, wherein the respective coding information included in the first packet header is indicative of a selection between a global sparsity value, a first configured sparsity value, or a second configured sparsity value.

Aspect 21. The apparatus of any of Aspects 1 to 20, wherein the at least one processor is further configured to: generate a respective sub-packet header corresponding to each compressed sub-packet of the plurality of compressed sub-packets; and generate the compressed data packet to further include each respective subpacket header and one or more non-sparsity bytes included in a respective sequence of values corresponding to each compressed sub-packet of the plurality of compressed sub-packets.

Aspect 22. The apparatus of Aspect 21, wherein the respective sequence of values corresponding to each compressed sub-packet comprises an uncompressed sequence of values included in an input data, and wherein the compressed data packet and the plurality of compressed sub-packets correspond to the input data.

Aspect 23. The apparatus of any of Aspects 1 to 22, wherein the first packet header is further indicative of a respective masking value corresponding to each compressed sub-packet of the plurality of compressed sub-packets.

Aspect 24. The apparatus of Aspect 23, wherein the respective masking value is indicative of the corresponding compressed sub-packet including all sparsity bytes or the corresponding compressed sub-packet including at least one non-sparsity byte.

Aspect 25. The apparatus of any of Aspects 1 to 24, wherein: the compressed data packet further includes a global header indicative of at least the configured sparsity value.

Aspect 26. The apparatus of any of Aspects 1 to 25, wherein: the compressed data packet further includes a global header indicative of a first configured sparsity value and a second configured sparsity value different from the first configured sparsity value; and the configured sparsity value for each compressed sub-packet of the plurality of compressed sub-packets comprises one of the first configured sparsity value or the second configured sparsity value.

Aspect 27. The apparatus of Aspect 26, wherein: a first subset of the plurality of compressed sub-packets is associated with a respective configured sparsity value equal to the first configured sparsity value; and a second subset of the plurality of compressed sub-packets is associated with a respective configured sparsity value equal to the second configured sparsity value.

Aspect 28. The apparatus of any of Aspects 26 to 27, wherein the at least one processor is further configured to: determine the configured sparsity value for the first compressed sub-packet based on the first sequence of values corresponding to the first sub-packet.

Aspect 29. The apparatus of Aspect 28, wherein the configured sparsity value comprises a sparsity value having a highest frequency of occurrence within the first sequence of values.

Aspect 30. A method for compressing data, comprising: generating a first compressed sub-packet based on removing one or more sparsity bytes from a first sequence of values corresponding to a first sub-packet, wherein the first sequence of values includes one or more sparsity bytes each equal to a configured sparsity value and one or more non-sparsity bytes each corresponding to a respective data value different from the configured sparsity value; generating a first sub-packet header corresponding to the first compressed sub-packet, wherein the first sub-packet header is indicative of a respective location within the first sequence of values of each non-sparsity byte of the one or more non-sparsity bytes; generating a first packet header corresponding to a plurality of compressed sub-packets including the first compressed sub-packet, wherein the first packet header is indicative of the configured sparsity value and respective coding information corresponding to each compressed sub-packet of the plurality of compressed sub-packets; and generating a compressed data packet, wherein the compressed data packet includes at least the first packet header, the first sub-packet header, and the one or more non-sparsity bytes included in the first sequence of values.

Aspect 31. The method of Aspect 30, wherein the compressed data packet includes the first packet header, a respective sub-packet header corresponding to each compressed sub-packet of the plurality of compressed sub-packets, and a respective one or more non-sparsity bytes included in a respective sequence of values corresponding to each compressed sub-packet of the plurality of compressed sub-packets.

Aspect 32. The method of Aspect 31, wherein the respective sub-packet header corresponding to each compressed sub-packet of the plurality of compressed sub-packets is included in a second packet header associated with the compressed data packet.

Aspect 33. The method of any of Aspects 30 to 32, wherein the compressed data packet further includes a second packet header, the second packet header including a respective sub-packet header corresponding to each compressed sub-packet of the plurality of compressed sub-packets.

Aspect 34. The method of Aspect 33, wherein the respective sub-packet header corresponding to each compressed sub-packet of the plurality of compressed sub-packets is indicative of corresponding location information of one or more sparsity bytes within a respective sequence of values associated with each compressed sub-packet of the plurality of compressed sub-packets.

Aspect 35. The method of any of Aspects 33 to 34, wherein the second packet header is indicative of sparsity location information for each respective compressed sub-packet of the plurality of compressed sub-packets.

Aspect 36. The method of any of Aspects 33 to 35, wherein the second packet header is indicative of a respective masking sequence for each compressed sub-packet of the plurality of compressed sub-packets, and wherein the respective masking sequence is indicative of bit-sequence location information of non-sparsity values within a respective sequence of values associated with each compressed sub-packet of the plurality of compressed sub-packets.

Aspect 37. The method of any of Aspects 33 to 36, wherein the first packet header and the second packet header are included in a two-stage packet header indicative of compression information corresponding to the compressed data packet.

Aspect 38. The method of any of Aspects 30 to 37, wherein the compressed data packet further includes a global header associated with a plurality of compressed data packets including the compressed data packet.

Aspect 39. The method of Aspect 38, wherein each respective compressed data packet of the plurality of compressed data packets includes: a respective first packet header corresponding to a one or more compressed sub-packets included in the respective compressed data packet; and a respective second packet header corresponding to respective sub-packet headers of each compressed sub-packet of the one or more compressed sub-packets included in the respective compressed data packet.

Aspect 40. The method of any of Aspects 30 to 39, wherein the respective coding information included in the first packet header is indicative of a data packing mode associated with each compressed sub-packet of the plurality of compressed sub-packets corresponding to the compressed data packet.

Aspect 41. The method of Aspect 40, wherein the respective coding information is indicative of: an 8-bit data packing mode corresponding to an 8-byte sub-packet size and corresponding to four 8-byte sub-packets per compressed data packet, each 8-byte sub-packet including eight values; or a 16-bit data packing mode corresponding to a 16-byte sub-packet size and corresponding to two 16-byte sub-packets per compressed data packet, each 16-byte sub-packet including eight values.

Aspect 42. The method of any of Aspects 30 to 41, wherein the respective coding information included in the first packet header is indicative of a selection between a 4-bit, 8-bit, or 16-bit data packing mode associated with the plurality of compressed sub-packets.

Aspect 43. The method of any of Aspects 30 to 42, wherein the respective coding information included in the first packet header is indicative of: a Quad-Data-Macro (QDM) mode corresponding to sparsity-based compression based on structured sparsity or a non-QDM mode corresponding to sparsity-based compression based on random sparsity.

Aspect 44. The method of Aspect 43, wherein the QDM mode is associated with a plurality of structured sparsity patterns, each structured sparsity pattern of the plurality of structured sparsity patterns associated with a unique sequence of non-sparsity and sparsity bytes.

Aspect 45. The method of Aspect 44, wherein each structured sparsity pattern of the plurality of structured sparsity patterns is associated with a corresponding QDM encoding pattern indicative of the unique sequence.

Aspect 46. The method of Aspect 45, wherein a corresponding QDM encoding pattern for each compressed sub-packet of the plurality of compressed sub-packets is included in a second packet header corresponding to respective sub-packet headers associated with each compressed sub-packet of the plurality of compressed sub-packets.

Aspect 47. The method of any of Aspects 43 to 46, wherein the QDM mode is associated with 2:4 structured sparsity corresponding to two instances of the configured sparsity value per four values included in the first sequence of values.

Aspect 48. The method of any of Aspects 30 to 47, wherein the respective coding information included in the first packet header is indicative of a selection between a global sparsity value or a zero value for the configured sparsity value.

Aspect 49. The method of any of Aspects 30 to 48, wherein the respective coding information included in the first packet header is indicative of a selection between a global sparsity value, a first configured sparsity value, or a second configured sparsity value.

Aspect 50. The method of any of Aspects 30 to 49, further comprising: generating a respective sub-packet header corresponding to each compressed sub-packet of the plurality of compressed sub-packets; and generating the compressed data packet to further include each respective subpacket header and one or more non-sparsity bytes included in a respective sequence of values corresponding to each compressed sub-packet of the plurality of compressed sub-packets.

Aspect 51. The method of Aspect 50, wherein the respective sequence of values corresponding to each compressed sub-packet comprises an uncompressed sequence of values included in an input data, and wherein the compressed data packet and the plurality of compressed sub-packets correspond to the input data.

Aspect 52. The method of any of Aspects 30 to 51, wherein the first packet header is further indicative of a respective masking value corresponding to each compressed sub-packet of the plurality of compressed sub-packets.

Aspect 53. The method of Aspect 52, wherein the respective masking value is indicative of the corresponding compressed sub-packet including all sparsity bytes or the corresponding compressed sub-packet including at least one non-sparsity byte.

Aspect 54. The method of any of Aspects 30 to 53, wherein: the compressed data packet further includes a global header indicative of at least the configured sparsity value.

Aspect 55. The method of any of Aspects 30 to 54, wherein: the compressed data packet further includes a global header indicative of a first configured sparsity value and a second configured sparsity value different from the first configured sparsity value; and the configured sparsity value for each compressed sub-packet of the plurality of compressed sub-packets comprises one of the first configured sparsity value or the second configured sparsity value.

Aspect 56. The method of Aspect 55, wherein: a first subset of the plurality of compressed sub-packets is associated with a respective configured sparsity value equal to the first configured sparsity value; and a second subset of the plurality of compressed sub-packets is associated with a respective configured sparsity value equal to the second configured sparsity value.

Aspect 57. The method of any of Aspects 55 to 56, further comprising: determining the configured sparsity value for the first compressed sub-packet based on the first sequence of values corresponding to the first sub-packet.

Aspect 58. The method of Aspect 57, wherein the configured sparsity value comprises a sparsity value having a highest frequency of occurrence within the first sequence of values.

Aspect 59. A non-transitory computer-readable storage medium comprising instructions stored thereon which, when executed by at least one processor, causes the at least one processor to perform operations according to any of Aspects 1 to 29.

Aspect 60. A non-transitory computer-readable storage medium comprising instructions stored thereon which, when executed by at least one processor, causes the at least one processor to perform operations according to any of Aspects 30 to 58.

Aspect 61. An apparatus for compressing data comprising one or more means for performing operations according to any of Aspects 1 to 29.

Aspect 62. An apparatus for compressing data comprising one or more means for performing operations according to any of Aspects 30 to 58.

What is claimed is:

1. An apparatus for compressing data, comprising:
at least one memory; and
at least one processor coupled to the at least one memory, the at least one processor configured to:
generate a first compressed sub-packet based on removing one or more sparsity bytes from a first sequence of values corresponding to a first sub-packet, wherein the first sequence of values includes one or more sparsity bytes each equal to a configured sparsity value and one or more non-sparsity bytes each corresponding to a respective data value different from the configured sparsity value;
generate a first sub-packet header corresponding to the first compressed sub-packet, wherein the first sub-packet header is indicative of a respective location within the first sequence of values of each non-sparsity byte of the one or more non-sparsity bytes;
generate a first packet header corresponding to a plurality of compressed sub-packets including the first compressed sub-packet, wherein the first packet header is indicative of the configured sparsity value and respective coding information corresponding to each compressed sub-packet of the plurality of compressed sub-packets; and
generate a compressed data packet, wherein the compressed data packet includes at least the first packet header, the first sub-packet header, and the one or more non-sparsity bytes included in the first sequence of values.

2. The apparatus of claim 1, wherein the compressed data packet includes the first packet header, a respective sub-packet header corresponding to each compressed sub-packet of the plurality of compressed sub-packets, and a respective one or more non-sparsity bytes included in a respective sequence of values corresponding to each compressed sub-packet of the plurality of compressed sub-packets.

3. The apparatus of claim 2, wherein the respective sub-packet header corresponding to each compressed sub-packet of the plurality of compressed sub-packets is included in a second packet header associated with the compressed data packet.

4. The apparatus of claim 1, wherein the compressed data packet further includes a second packet header, the second packet header including a respective sub-packet header corresponding to each compressed sub-packet of the plurality of compressed sub-packets.

5. The apparatus of claim 4, wherein the respective sub-packet header corresponding to each compressed sub-packet of the plurality of compressed sub-packets is indicative of corresponding location information of one or more sparsity bytes within a respective sequence of values associated with each compressed sub-packet of the plurality of compressed sub-packets.

6. The apparatus of claim 4, wherein the second packet header is indicative of sparsity location information for each respective compressed sub-packet of the plurality of compressed sub-packets.

7. The apparatus of claim 4, wherein the second packet header is indicative of a respective masking sequence for each compressed sub-packet of the plurality of compressed sub-packets, and wherein the respective masking sequence is indicative of bit-sequence location information of non-sparsity values within a respective sequence of values associated with each compressed sub-packet of the plurality of compressed sub-packets.

8. The apparatus of claim 4, wherein the first packet header and the second packet header are included in a two-stage packet header indicative of compression information corresponding to the compressed data packet.

9. The apparatus of claim 1, wherein the compressed data packet further includes a global header associated with a plurality of compressed data packets including the compressed data packet.

10. The apparatus of claim 9, wherein each respective compressed data packet of the plurality of compressed data packets includes:
a respective first packet header corresponding to a one or more compressed sub-packets included in the respective compressed data packet; and
a respective second packet header corresponding to respective sub-packet headers of each compressed sub-packet of the one or more compressed sub-packets included in the respective compressed data packet.

11. The apparatus of claim 1, wherein the respective coding information included in the first packet header is indicative of a data packing mode associated with each compressed sub-packet of the plurality of compressed sub-packets corresponding to the compressed data packet.

12. The apparatus of claim 11, wherein the respective coding information is indicative of:
an 8-bit data packing mode corresponding to an 8-byte sub-packet size and corresponding to four 8-byte sub-packets per compressed data packet, each 8-byte sub-packet including eight values; or
a 16-bit data packing mode corresponding to a 16-byte sub-packet size and corresponding to two 16-byte sub-packets per compressed data packet, each 16-byte sub-packet including eight values.

13. The apparatus of claim 1, wherein the respective coding information included in the first packet header is indicative of a selection between a 4-bit, 8-bit, or 16-bit data packing mode associated with the plurality of compressed sub-packets.

14. The apparatus of claim 1, wherein the respective coding information included in the first packet header is indicative of:
a Quad-Data-Macro (QDM) mode corresponding to sparsity-based compression based on structured sparsity or a non-QDM mode corresponding to sparsity-based compression based on random sparsity.

15. The apparatus of claim 14, wherein the QDM mode is associated with a plurality of structured sparsity patterns, each structured sparsity pattern of the plurality of structured sparsity patterns associated with a unique sequence of non-sparsity and sparsity bytes.

16. The apparatus of claim 15, wherein each structured sparsity pattern of the plurality of structured sparsity patterns is associated with a corresponding QDM encoding pattern indicative of the unique sequence.

17. The apparatus of claim 16, wherein a corresponding QDM encoding pattern for each compressed sub-packet of the plurality of compressed sub-packets is included in a second packet header corresponding to respective sub-packet headers associated with each compressed sub-packet of the plurality of compressed sub-packets.

18. The apparatus of claim 14, wherein the QDM mode is associated with 2:4 structured sparsity corresponding to two instances of the configured sparsity value per four values included in the first sequence of values.

19. The apparatus of claim 1, wherein the respective coding information included in the first packet header is indicative of a selection between a global sparsity value or a zero value for the configured sparsity value.

20. The apparatus of claim 1, wherein the respective coding information included in the first packet header is indicative of a selection between a global sparsity value, a first configured sparsity value, or a second configured sparsity value.

21. The apparatus of claim 1, wherein the at least one processor is further configured to:
generate a respective sub-packet header corresponding to each compressed sub-packet of the plurality of compressed sub-packets; and
generate the compressed data packet to further include each respective subpacket header and one or more non-sparsity bytes included in a respective sequence of values corresponding to each compressed sub-packet of the plurality of compressed sub-packets.

22. The apparatus of claim 21, wherein the respective sequence of values corresponding to each compressed sub-packet comprises an uncompressed sequence of values included in an input data, and wherein the compressed data packet and the plurality of compressed sub-packets correspond to the input data.

23. The apparatus of claim 1, wherein the first packet header is further indicative of a respective masking value corresponding to each compressed sub-packet of the plurality of compressed sub-packets.

24. The apparatus of claim 23, wherein the respective masking value is indicative of the corresponding compressed sub-packet including all sparsity bytes or the corresponding compressed sub-packet including at least one non-sparsity byte.

25. The apparatus of claim 1, wherein:
the compressed data packet further includes a global header indicative of at least the configured sparsity value.

26. The apparatus of claim 1, wherein:
the compressed data packet further includes a global header indicative of a first configured sparsity value and a second configured sparsity value different from the first configured sparsity value; and
the configured sparsity value for each compressed sub-packet of the plurality of compressed sub-packets comprises one of the first configured sparsity value or the second configured sparsity value.

27. The apparatus of claim 26, wherein:
a first subset of the plurality of compressed sub-packets is associated with a respective configured sparsity value equal to the first configured sparsity value; and
a second subset of the plurality of compressed sub-packets is associated with a respective configured sparsity value equal to the second configured sparsity value.

28. The apparatus of claim 26, wherein the at least one processor is further configured to:
determine the configured sparsity value for the first compressed sub-packet based on the first sequence of values corresponding to the first sub-packet.

29. The apparatus of claim 28, wherein the configured sparsity value comprises a sparsity value having a highest frequency of occurrence within the first sequence of values.

30. A method for compressing data, comprising:
generating a first compressed sub-packet based on removing one or more sparsity bytes from a first sequence of values corresponding to a first sub-packet, wherein the first sequence of values includes one or more sparsity bytes each equal to a configured sparsity value and one or more non-sparsity bytes each corresponding to a respective data value different from the configured sparsity value;
generating a first sub-packet header corresponding to the first compressed sub-packet, wherein the first sub-packet header is indicative of a respective location within the first sequence of values of each non-sparsity byte of the one or more non-sparsity bytes;
generating a first packet header corresponding to a plurality of compressed sub-packets including the first compressed sub-packet, wherein the first packet header is indicative of the configured sparsity value and respective coding information corresponding to each compressed sub-packet of the plurality of compressed sub-packets; and
generating a compressed data packet, wherein the compressed data packet includes at least the first packet header, the first sub-packet header, and the one or more non-sparsity bytes included in the first sequence of values.

* * * * *